US012739979B2

(12) United States Patent
Cheng et al.

(10) Patent No.: US 12,739,979 B2
(45) Date of Patent: Sep. 15, 2026

(54) METHOD OF MANUFACTURING TRANSIENT ELECTRONICS

(71) Applicant: Accenture Global Solutions Limited, Dublin (IE)

(72) Inventors: Tingyu Cheng, Atlanta, GA (US); Taylor Tabb, San Francisco, CA (US); Eric Michael Gallo, Moretown, VT (US); Jung Wook Park, Foster City, CA (US); Aditi Maheshwari, San Francisco, CA (US); Lavinia Andreea Danielescu, Seattle, WA (US); Luke Fabrice Gockowski, Oakland, CA (US)

(73) Assignee: ACCENTURE GLOBAL SOLUTIONS LIMITED, Dublin (IE)

( * ) Notice: Subject to any disclaimer, the term of this patent is extended or adjusted under 35 U.S.C. 154(b) by 327 days.

(21) Appl. No.: 18/241,304

(22) Filed: Sep. 1, 2023

(65) Prior Publication Data

US 2024/0080991 A1 Mar. 7, 2024

Related U.S. Application Data

(60) Provisional application No. 63/403,133, filed on Sep. 1, 2022.

(51) Int. Cl.
*H05K 3/12* (2006.01)
*A23G 1/00* (2006.01)
(Continued)

(52) U.S. Cl.
CPC ......... *H05K 3/1208* (2013.01); *A23G 1/0003* (2013.01); *A23G 1/325* (2013.01);
(Continued)

(58) Field of Classification Search
CPC ...... H05K 3/1208; H05K 3/0014; H05K 3/20; H05K 3/28; H05K 3/388;
(Continued)

(56) References Cited

PUBLICATIONS

Yoon et al. "Three-Dimensional Printed Poly(vinyl alcohol) Substrate with Controlled On-Demand Degradation for Transient Electronics". ACSNano, Jun. 26, 2018 12(6):6006-6012 (Year: 2018).*
(Continued)

*Primary Examiner* — Alexander M Weddle
(74) *Attorney, Agent, or Firm* — Mannava & Kang, P.C.

(57) ABSTRACT

The present disclosure relates to electronic devices and methods of manufacturing electronic devices. A method of manufacturing a dissolvable electronic device includes forming a dissolvable sheet; applying a self-sintering agent to the dissolvable sheet to form a substrate; and depositing electrically conductive ink onto the substrate in a trace. A method of manufacturing a meltable electronic device includes mixing a conductive material with a melted wax to form a conductive wax mixture in liquid form; molding the conductive wax mixture; and solidifying the conductive wax mixture to obtain the meltable electronic device. A method of manufacturing an edible electronic device includes cutting a layer of conductive material to form a pattern that defines a circuit; applying the layer of conductive material to an edible medium, wherein the edible medium is in liquid or semi-solid form; and solidifying the edible medium to obtain the edible electronic device.

10 Claims, 23 Drawing Sheets

(51) Int. Cl.
*A23G 1/32* (2006.01)
*A23G 1/54* (2006.01)
*A23G 7/00* (2006.01)
*B33Y 10/00* (2015.01)
*B33Y 40/20* (2020.01)
*B33Y 70/10* (2020.01)
*G01D 5/24* (2006.01)
*H05K 3/00* (2006.01)
*H05K 3/20* (2006.01)
*H05K 3/28* (2006.01)

(52) U.S. Cl.
CPC ............ *A23G 1/54* (2013.01); *A23G 7/0043* (2013.01); *B33Y 10/00* (2014.12); *B33Y 40/20* (2020.01); *B33Y 70/10* (2020.01); *G01D 5/24* (2013.01); *H05K 3/0014* (2013.01); *H05K 3/20* (2013.01); *H05K 3/28* (2013.01)

(58) Field of Classification Search
CPC ........... H05K 2201/0323; H05K 1/032; H05K 1/097; H05K 3/101; A23G 1/0003; A23G 1/325; A23G 1/54; A23G 7/0043; B33Y 10/00; B33Y 40/20; B33Y 70/10; B33Y 70/00; B33Y 80/00; G01D 5/24
See application file for complete search history.

(56) References Cited

PUBLICATIONS

Wu, P et al. "Self-sintering liquid metal ink with LAPONITE® for flexible electronics". J Mater. Chem. C. 2021, 9,3070-3080. (Year: 2021).*
Abdullah et al., "PVA, PVA Blends, and Their Nanocomposites for Biodegradable Packaging Application," Polymer-Plastics Technology and Engineering, Apr. 5, 2017, 56(12):1307-1344.
Afsar et al., "OmniFiber: Integrated Fluidic Fiber Actuators for Weaving Movement based Interactions into the 'Fabric of Everyday Life'," Proceedings of the 34th Annual ACM Symposium on User Interface Software and Technology, Oct. 2021, 1010-1026.
Amazon.com [online], "24K Genuine Edible Gold Leaf by Kingboom, 10 Sheets Gold Foil, Loose Leaf for Cake and Coffee, 3.15 inches per Sheet, 10 Sheets per Pack," upon information and belief, available no later than May 11, 2023, retrieved on Jan. 22, 2024, retrieved from URL<https://www.amazon.com/dp/B098DX2HJ5?ref=ppx_yo2ov_dt_b_product_det ails&th=1>, 6 pages.
Amazon.com [online], "Howemon White Beeswax Pellets 2LB 100% Pure and Natural Triple Filtered for Skin, Face, Body and Hair Care DIY Creams, Lotions, Lip Balm and Soap Making Supplies," upon information and belief, available no later than May 11, 2023, retrieved on Jan. 22, 2024, retrieved from URL<https://www.amazon.com/dp/B07NMNDT1W?ref-nb_sb_ss w as-reorder-t1_ypp_rep_k2_1_6&-undefined&crid=00QDS067ZEDC&sprefix-beewax&th=1>, 5 pages.
Amazon.com [online], "Hydrographics Film—Blank Water Transfer Printing Film—12 Pcs A4 Size Blank Water Transfer Printing Film—Blank Water Transfer Film," upon information and belief, available no later than May 11, 2023, retrieved on Jan. 19, 2024, retrieved from URL<https://www.amazon.com/dp/B07H25HH6J?ref=nb_sb ss w_as- reordertl_ypp_rep_k0_1_8&&crid=QLUEEBL9O6AN&&sprefix=hydrogra >, 6 pages.
An et al., "Thermorph: Democratizing 4D Printing of Self-Folding Materials and Interfaces," Proceedings of the 2018 CHI Conference on Human Factors in Computing Systems, Apr. 2018, 12 pages.
Bettinger et al., "Organic Thin-Film Transistors Fabricated on Resorbable Biomaterial Substrates," Advanced Materials, Feb. 2, 2010, 22(5):651-655.
Blevis, "Sustainable interaction design: invention & disposal, renewal & reuse," Proceedings of the SIGCHI Conference on Human Factors in Computing Systems, Apr. 2007, 503-512.
Brynjarsdottir et al., "Sustainably unpersuaded: how persuasion narrows our vision of sustainability," Proceedings of the SIGCHI Conference on Human Factors in Computing Systems, May 2012, 947-956.
Cheng et al., "Duco: Autonomous Large-Scale Direct-Circuit-Writing (DCW) on Vertical Everyday Surfaces Using a Scalable Hanging Plotter," Proceedings of the ACM on Interactive, Mobile, Wearable and Ubiquitous Technologies, Sep. 14, 2021, 5(3):92, 25 pages.
Cheng et al., "Functional Destruction: utilizing sustainable materials' physical transiency for electronics applications," Proceedings of the 2023 CHI Conference on Human Factors in Computing Systems, Apr. 2023, 16 pages.
Cheng et al., "PITAS: Sensing and Actuating Embedded Robotic Sheet for Physical Information Communication," Proceedings of the 2022 CHI Conference on Human Factors in Computing Systems, Apr. 2022, 16 pages.
Cheng et al., "Silver Tape: Inkjet-Printed Circuits Peeled-and-Transferred on Versatile Substrates," Proceedings of the ACM on Interactive, Mobile, Wearable and Ubiquitous Technologies, Mar. 18, 2020, 4(1):6, 17 pages.
DiSalvo et al., "Mapping the landscape of sustainable HCI," Proceedings of the SIGCHI Conference on Human Factors in Computing Systems, Apr. 2010, 1975-1984.
Fan et al., "Fractal design concepts for stretchable electronics," Nature Communications, Feb. 7, 2014, 5:3266, 8 pages.
FascoEpoxies.com [online], "Graphite Powder Filler," available on or before Jul. 19, 2018 via Internet Archive: Wayback Machine URL<https://web.archive.org/web/20180719044935/https://fascoepoxies.com/Graphi te-Powder-Filler.html>, retrieved on Jan. 19, 2024, retrieved from URL<https://fascoepoxies.com/Graphite-Powder-Filler.html>, 3 pages.
Follmer et al., "inFORM: Dynamic Physical Affordances and Constraints through Shape and Object Actuation," Proceedings of the 26th Annual ACM Symposium on User Interface Software and Technology, Oct. 2013, 417-426.
Forman et al., "Modifiber: Two-way morphing soft thread actuators for tangible interaction," Proceedings of the 2019 CHI Conference on Human Factors in Computing Systems, May 2019, 11 pages.
Fu et al., "Transient electronics: materials and devices," Chemistry of Materials, Apr. 28, 2016, 28(11):3527-3539.
Groeger et al., "ObjectSkin: augmenting everyday objects with hydroprinted touch sensors and displays," Proceedings of the ACM on Interactive, Mobile, Wearable and Ubiquitous Technologies, Jan. 8, 2018, 1(4):134, 23 pages.
Gumus et al., "Expandable Polymer Enabled Wirelessly Destructible High-Performance Solid State Electronics," Advanced Materials Technologies, May 2017, 2(5):1600264, 30 pages.
Hanstveit, "Biodegradability of petroleum waxes and beeswax in an adapted CO2 evolution test," Chemosphere, Aug. 1992, 25(4):605-620.
Herrojo et al., "Chipless-RFID: A review and recent developments," Sensors, Aug. 2019, 19(15):3385, 20 pages.
Hwang et al., "A physically transient form of silicon electronics," Science, Sep. 28, 2012, 337(6102):1640-1644.
Hwang et al., "Biodegradable elastomers and silicon nanomembranes/nanoribbons for stretchable, transient electronics, and biosensors," Nano Letters, Feb. 23, 2015, 15(5):2801-2808.
Hwang et al., "High-performance biodegradable/transient electronics on biodegradable polymers," Advanced Materials, Jun. 18, 2014, 26(23):3905-3911.
Hwang et al., "Materials and fabrication processes for transient and bioresorbable high-performance electronics," Advanced Functional Materials, Sep. 2013, 23(33):4087-4093.
Jamshidi et al., "Transient Electronics as Sustainable Systems: From Fundamentals to Applications," Advanced Sustainable Systems, Feb. 2022, 6(2):2100057, 13 pages.
Jin et al., "Solution-processed single-walled carbon nanotube field effect transistors and bootstrapped inverters for disintegratable, transient electronics," Applied Physics Letters, Jul. 8, 2014, 105(1):013506, 4 pages.

(56) References Cited

PUBLICATIONS

Kaimoto et al., "ExpandFab: Fabricating Objects Expanding and Changing Shape with Heat," Proceedings of the Fourteenth International Conference on Tangible, Embedded, and Embodied Interaction, Feb. 2020, 153-164.
Kang et al., "Dissolution Chemistry and Biocompatibility of Silicon- and Germanium-Based Semiconductors for Transient Electronics," ACS Applied Materials & Interfaces, Apr. 13, 2015, 7(17):9297-9305.
Kao et al., "DuoSkin: rapidly prototyping on-skin user interfaces using skin-friendly materials," Proceedings of the 2016 ACM International Symposium on Wearable Computers, Sep. 2016, 16-23.
Kawahara et al., "Instant inkjet circuits: lab-based inkjet printing to support rapid prototyping of UbiComp devices," Proceedings of the 2013 ACM International Joint Conference on Pervasive and Ubiquitous Computing, Sep. 2013, 363-372.
Khan et al., "Soft Inkjet Circuits: Rapid Multi-Material Fabrication of Soft Circuits using a Commodity Inkjet Printer," Proceedings of the 32nd Annual ACM Symposium on User Interface Software and Technology, Oct. 2019, 341-354.
Kim et al., "Dissolvable films of silk fibroin for ultrathin conformal bio-integrated electronics," Nature Materials, Apr. 18, 2010, 9(6):511-517.
Laput et al., "Synthetic Sensors: Towards General-Purpose Sensing," Proceedings of the 2017 CHI Conference on Human Factors in Computing Systems, May 2017, 3986-3999.
LaserPecker.net [online], "L1 Pro Super: The Most Compact & Safe & Easy to use Laser Engraver with auto-stand and big cases," available on or before Aug. 8, 2022 via Internet Archive: Wayback Machine URL<https://web.archive.org/web/20220808074950/https://www.laserpecker.net/Products/L1-Pro-Super-The-Most-Compact-Safe-Easy-to-Use-Laser-Engraver-with- auto-stand-and-big-cases-p1709164.html>, retrieved on Jan. 22, 2024, retrieved from URL<https://web.archive.org/web/20220808074950/https://www.laserpecker.net/Pro ducts/L1-Pro-Super-The-Most-Compact-Safe-Easy-to-Use-Laser-Engraver-with-auto-stand-and-big-cases-p1709164.html>, 13 pages.
Luo et al., "Digital Fabrication of Pneumatic Actuators with Integrated Sensing by Machine Knitting," Proceedings of the 2022 CHI Conference on Human Factors in Computing Systems, Apr. 2022, 13 pages.
Maheshwari et al., "Designing Tools and Interfaces for Ecological Restoration: An Investigation into the Opportunities and Constraints for Technological Interventions," Proceedings of the 2022 CHI Conference on Human Factors in Computing Systems, Apr. 2022, 17 pages.
Mankoff et al., "Environmental sustainability and interaction," CHI '07 Extended Abstracts on Human Factors in Computing Systems, Apr. 2007, 2121-2124.
MPM.co.jp [online], "Silver Nano," available on or before Jun. 20, 2022 via Internet Archive: Wayback Machine URL<https://web.archive.org/web/20220620100309/https://www.mpm.co.jp/electronic/eng/silver-nano/index.html>, retrieved on Jan. 22, 2024, retrieved from URL<https://www.mpm.co.jp/electronic/eng/silver-nano/index.html>, 2 pages.
Murer et al., "Un-Crafting: Exploring Tangible Practices for Deconstruction in Interactive System Design," Proceedings of the Ninth International Conference on Tangible, Embedded, and Embodied Interaction, Jan. 2015, 469-472.
Muthukumarana et al., "ClothTiles: A Prototyping Platform to Fabricate Customized Actuators on Clothing using 3D Printing and Shape-Memory Alloys," Proceedings of the 2021 CHI Conference on Human Factors in Computing Systems, May 2021, 12 pages.
Narumi et al., "Self-healing UI: Mechanically and Electrically Self-healing Materials for Sensing and Actuation Interfaces," Proceedings of the 32nd Annual ACM Symposium on User Interface Software and Technology, Oct. 2019, 293-306.
Nisser et al., "Sequential Support: 3D Printing Dissolvable Support Material for Time-Dependent Mechanisms," Proceedings of the Thirteenth International Conference on Tangible, Embedded, and Embodied Interaction, May 2019, 669-676.
Pietsch et al., "Biodegradable inkjet-printed electrochromic display for sustainable short-lifecycle electronics," Journal of Materials Chemistry C, Nov. 4, 2020, 8(47):16716-16724.
QuickDams.com [online], "Quick Dam Flood Control Solutions," available on or before May 16, 2013 via Internet Archive: Wayback Machine URL<https://web.archive.org/web/20130516115747/http://www.quickdams.com/>, retrieved on Jan. 19, 2024, retrieved from URL<https://quickdams.com/>, 5 pages.
Rance et al., "Toward RCS Magnitude Level Coding for Chipless RFID," IEEE Transactions on Microwave Theory and Techniques, Jul. 2016, 64(7):2315-2325.
Rautela et al., "E-waste management and its effects on the environment and human health," Science of the Total Environment, Jun. 15, 2021, 773:145623, 16 pages.
Remya et al., "Role of Nanoparticles in Biodegradation and Their Importance in Environmental and Biomedical Applications," Journal of Nanomaterials, Jan. 28, 2022, 2022:6090846, 15 pages.
Sabie et al., "Unmaking@CHI: Concretizing the Material and Epistemological Practices of Unmaking in HCI," Extended Abstracts of the 2022 CHI Conference on Human Factors in Computing Systems, Apr. 2022, 6 pages.
Segawa et al., "Rapid Prototyping of Paper Electronics Using a Metal Leaf and Laser Printer," Adjunct Proceedings of the 32nd Annual ACM Symposium on User Interface Software and Technology, Oct. 2019, 99-101.
Shim et al., "Physically transient electronic materials and devices," Materials Science and Engineering: R: Reports, Jul. 2021, 145:100624, 41 pages.
Song et al., "Towards Decomposable Interactive Systems: Design of a Backyard- Degradable Wireless Heating Interface," Proceedings of the 2022 CHI Conference on Human Factors in Computing Systems, Apr. 2022, 12 pages.
Song et al., "Unmaking: Enabling and Celebrating the Creative Material of Failure, Destruction, Decay, and Deformation," Proceedings of the 2021 CHI Conference on Human Factors in Computing Systems, May 2021, 12 pages.
Swaminathan et al., "OptiStructures: Fabrication of Room-Scale Interactive Structures with Embedded Fiber Bragg Grating Optical Sensors and Displays," Proceedings of the ACM on Interactive, Mobile, Wearable and Ubiquitous Technologies, Jun. 15, 2020, 4(2):50, 21 pages.
Vasquez et al., "Introducing the Sustainable Prototyping Life Cycle for Digital Fabrication to Designers," Proceedings of the 2020 ACM Designing Interactive Systems Conference, Jul. 2020, 1301-1312.
Vasquez et al., "The Environmental Impact of Physical Prototyping: a Five-Year CHI Review," Proceedings of the Self-Sustainable CHI Workshop, Apr. 2020, 8 pages.
Vena et al., "Chipless RFID Tag Using Hybrid Coding Technique," IEEE Transactions on Microwave Theory and Techniques, Dec. 2011, 59(12):3356-3364.
Wang et al., "Printed Paper Actuator: A Low-cost Reversible Actuation and Sensing Method for Shape Changing Interfaces," Proceedings of the 2018 CHI Conference on Human Factors in Computing Systems, Apr. 2018, 12 pages.
Want, "An Introduction to RFID Technology," IEEE Pervasive Computing, Jan. 2006, 5(1):25-33.
Won et al., "Natural Wax for Transient Electronics," Advanced Functional Materials, Aug. 8, 2018, 28(32):1801819, 10 pages.
Wu et al., "Edible and Nutritive Electronics: Materials, Fabrications, Components, and Applications," Advanced Materials Technologies, Oct. 2020, 5(10):2000100, 28 pages.
Wu et al., "Unfabricate: Designing Smart Textiles for Disassembly," Proceedings of the 2020 CHI Conference on Human Factors in Computing Systems, Apr. 2020, 14 pages.
Xu et al., "Food-Based Edible and Nutritive Electronics," Advanced Materials Technologies, Nov. 2017, 2(11):1700181, 7 pages.
Yao et al., "PneUI: Pneumatically Actuated Soft Composite Materials for Shape Changing Interfaces," Proceedings of the 26th Annual ACM Symposium on User Interface Software and Technology, Oct. 2013, 13-22.
Yin et al., "Dissolvable Metals for Transient Electronics," Advanced Functional Materials, Feb. 5, 2014, 24(5):645-658.

(56) References Cited

PUBLICATIONS

Yoon et al., "A Three-Dimensional Printed Poly(vinyl alcohol) Substrate with Controlled On-Demand Degradation for Transient Electronics," ACS Nano, Jun. 26, 2018, 12(6):6006-6012.
Yoon et al., "A Three-Dimensional Printed Poly(vinyl alcohol) Substrate with Controlled On-Demand Degradation for Transient Electronics," ACS Nano, Jun. 26, 2018, 12(6):6006-6012 (Supporting Information, 9 pages).
Zeng et al., "Progress and Challenge for Magnesium Alloys as Biomaterials," Advanced Engineering Materials, Jul. 14, 2008, 10(8):B3-B14.
Zhang et al., "Electrically conductive carbon nanofiber/paraffin wax composites for electric thermal storage," Energy Conversion and Management, Dec. 2012, 64:62-67.

* cited by examiner 132
136
114b 140
170
144

116
120
114a 124
114c
128

148 152 156
160
164
152 156 164
156
152
5 sec
30 sec
2 min
20 min
160
160

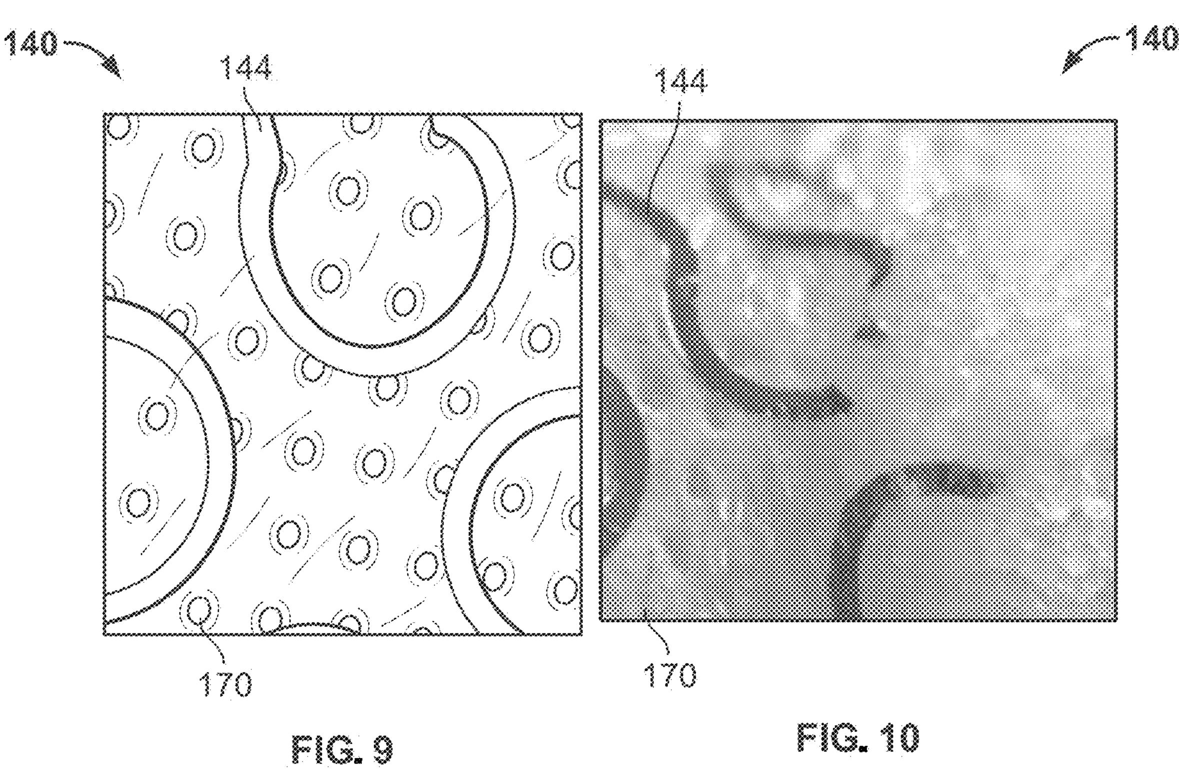
FIG. 9
FIG. 10
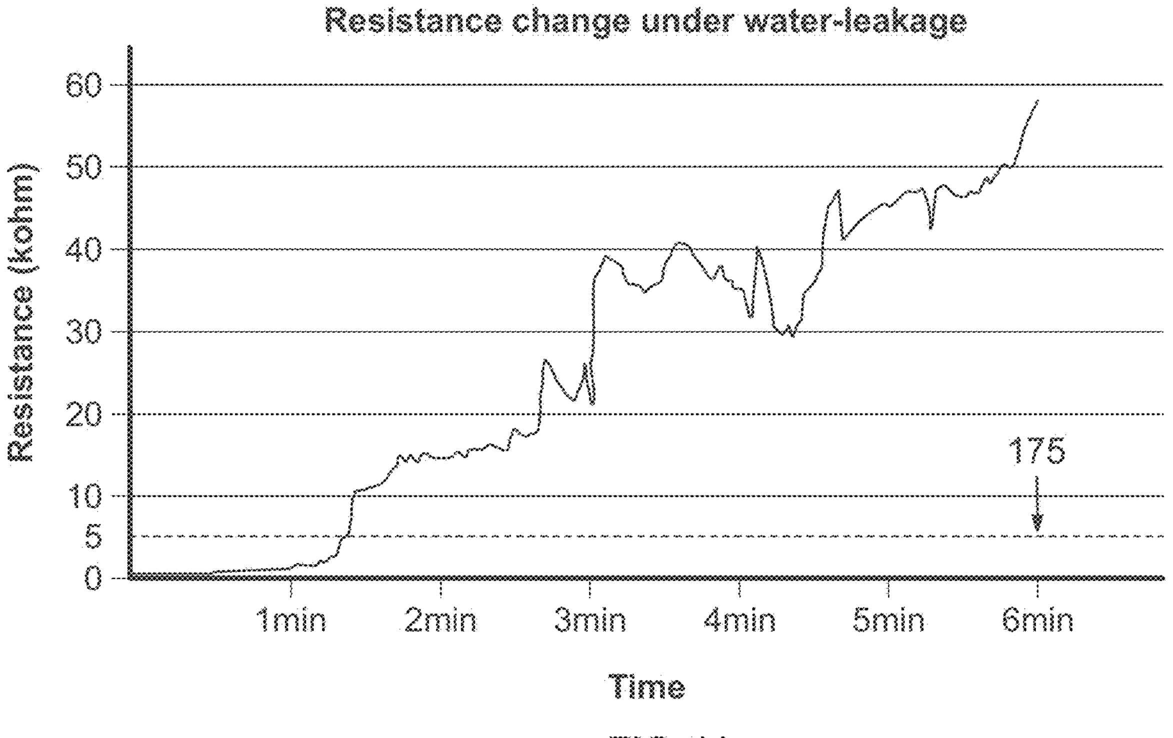
FIG. 11

400

METHOD OF MANUFACTURING TRANSIENT ELECTRONICS

CROSS-REFERENCE TO RELATED APPLICATIONS

This application claims the benefit of the U.S. Provisional Patent Application No. 63/403,133, filed Sep. 1, 2022, which is incorporated herein by reference in its entirety.

TECHNICAL FIELD

The present disclosure relates to a method of manufacturing an electronic device, and specifically, methods of manufacturing transient electronic devices.

BACKGROUND

Electronics can be manufactured to provide stable functionality and fixed physical forms optimized for reliable operation over long periods and repeated use. The permanence of electronics comes with environmental consequences, such as e-waste. The composition of electronic devices makes the recycling process more challenging than that of other materials like metals and cardboard. This is exacerbated by the increasing rate at which smart devices are produced, leading to more e-waste than can be recycled.

SUMMARY

The present disclosure relates to methods of manufacturing transient electronic devices for a variety of applications and mediums. Transient electronics have the ability to chemically dissolve, physically dissolve, disintegrate, degrade, or disassemble in a prescribed way. Such electronics are components, devices, and systems that can physically transform or degrade (e.g., dissolve) over time coinciding with failure of operation. Transient electronic technology aims to reduce waste created by electronics by creating single-use or reusable electronics that are environmentally benign. To enhance the practical applications of these devices, a transient and sustainable chipless radiofrequency (RF) detection system can be implemented. Passive wireless interaction can be implemented with various substrates, including hydrographic films, wax, and edible media.

In general, one innovative aspect of the subject matter described in this specification can be embodied in a method of manufacturing a dissolvable electronic device, including: forming a dissolvable sheet; applying a self-sintering agent to the dissolvable sheet to form a substrate; and depositing electrically conductive ink onto the substrate in a trace to obtain the dissolvable electronic device.

The foregoing and other embodiments can each optionally include one or more of the following features, alone or in combination.

In some implementations, applying the self-sintering agent to the dissolvable sheet includes coating the dissolvable sheet with the self-sintering agent, the self-sintering agent including at least one of: aluminum-oxide and silicone oxide.

In some implementations, the dissolvable sheet is formed from a solidifiable water-soluble synthetic polymer material.

In some implementations, the method includes forming the dissolvable sheet in an additive manufacturing operation, including: providing one or more materials for the dissolvable sheet to a three-dimensional printer device; and providing instructions to the three-dimensional printer device to prepare the dissolvable sheet. The three-dimensional printer device is selected from: a fused deposition modeling printer, a stereolithography printer, a digital light processing printer, a selective laser sintering printer, a selective laser melting printer, a laminated object manufacturing printer, and a digital beam melting printer.

In some implementations, the method includes forming the dissolvable sheet by stacking, including: selecting a first rate of dissolvability for the dissolvable sheet; determining a first thickness of a solidifiable water-soluble material that corresponds to the first rate of dissolvability; and stacking one or more layers of the solidifiable water-soluble material to form the dissolvable sheet, the dissolvable sheet having the first thickness.

In some implementations, depositing the electrically conductive ink onto the substrate includes forming a design to create a circuit with the electrically conductive ink, the circuit including at least one of: a heater, a resistor, an electronic trace, a capacitor, an inductor, a sensor, and a passive wireless circuit.

In some implementations, the method includes forming the dissolvable sheet in an additive manufacturing operation, including: selecting a first rate of dissolvability for the dissolvable sheet; determining a first thickness of a solidifiable water-soluble material that corresponds to the first rate of dissolvability; and depositing, by a three-dimensional printer, one or more layers of the solidifiable water-soluble material to form the dissolvable sheet, the dissolvable sheet having the first thickness.

In some implementations, the method includes forming the dissolvable sheet in an additive manufacturing operation, including: selecting a first rate of dissolvability for a first portion of the dissolvable sheet; determining a first thickness of a solidifiable water-soluble material that corresponds to the first rate of dissolvability; selecting a second rate of dissolvability for a second portion of the dissolvable sheet; determining a second thickness of the solidifiable water-soluble material that corresponds to the second rate of dissolvability; depositing, by a three-dimensional printer, one or more layers of the solidifiable water-soluble material to form the first portion of the dissolvable sheet having the first thickness; and depositing, by the three-dimensional printer, one or more layers of the solidifiable water-soluble material to form the second portion of the dissolvable sheet having the second thickness.

In some implementations, the method includes selecting a first conductivity of the trace; determining a first amount of the electrically conductive ink that corresponds to the first conductivity; and depositing, by one of an inkjet printer, an additive manufacturing machine, a screen printing machine, a painting device, or a stenciling device, the first amount of the electrically conductive ink onto the substrate in the trace, the trace having the first conductivity.

In some implementations, the method includes coupling a substrate to a hydrogel-embedded fabric to form a water leakage sensor. The substrate is configured to dissolve when water passes through the hydrogel-embedded fabric.

In general, one innovative aspect of the subject matter described in this specification can be embodied in a method of manufacturing a meltable electronic device, including: mixing a conductive material with a melted wax to form a conductive wax mixture in liquid form; molding the conductive wax mixture; and solidifying the conductive wax mixture to obtain the meltable electronic device.

The foregoing and other embodiments can each optionally include one or more of the following features, alone or in combination.

In some implementations, the conductive material includes a graphite powder.

In some implementations, the meltable electronic device includes a wax-based capacitive touch sensor, the method including: molding the conductive wax mixture to form a button. A change in a touch area of the button causes a change in capacitance of the button.

In some implementations, the meltable electronic device includes a wax-based bending sensor, the method including: molding the conductive wax mixture by flattening the conductive wax mixture to form a sheet having a thickness of ten millimeters or less. A change in bending of the sheet causes a change in electrical resistance across the sheet.

In general, one innovative aspect of the subject matter described in this specification can be embodied in a method of manufacturing an edible electronic device, including: cutting a layer of conductive material to form a pattern that defines a circuit; applying the layer of conductive material to an edible medium. The edible medium is in liquid or semi-solid form; and solidifying the edible medium to obtain the edible electronic device. The edible electronic device includes the circuit integrated with the edible medium.

The foregoing and other embodiments can each optionally include one or more of the following features, alone or in combination.

In some implementations, the circuit includes at least one of: a heater, a resistor, an electronic trace, a capacitor, an inductor, a sensor, and a passive wireless circuit.

In some implementations, the layer of conductive material includes edible gold foil or silver foil.

In some implementations, the edible medium includes at least one of chocolate, caramel, batter, and dough.

In some implementations, the method includes: coupling a first side of the layer of conductive material to a first substrate suitable for insertion into a laser cutter; cutting the layer of conductive material, including inserting the layer of conductive material and the first substrate into the laser cutter; after cutting the layer of conductive material, coupling a second side of the layer of conductive material to an edible substrate. The second side is opposite the first side; and removing the first substrate from the first side of the layer of conductive material.

In some implementations, the method includes: applying the layer of conductive material to the edible medium by contacting the first side of the layer of conductive material with the edible medium; removing the edible substrate from the second side of the layer of conductive material after solidifying the edible medium; and applying a glazing agent to the second side of the layer of conductive material.

In some implementations, a method of manufacturing an electronic device can include forming a sheet using an additive manufacturing technique. The method can include coating the sheet with a self-sintering agent to create a self-sintering substrate, and depositing conductive ink onto the self-sintering substrate in a design to form a dissolvable, self-sintered electronic trace.

In some implementations, a method of manufacturing an electronic device can include forming a sheet using an additive manufacturing technique. The sheet is water-soluble. The method can include coating the sheet with a self-sintering agent to create a self-sintering substrate. The method can further include depositing conductive ink onto the self-sintering substrate to form a circuit on the substrate, thereby forming a dissolvable, self-sintered electronic trace.

In some implementations, a method of manufacturing an electronic device can include combining a conductive material to a wax. The wax is in liquid form. The method can further include molding the wax to a selected shape, and solidifying the wax.

In some implementations, a bio-degradable sensor can include a wax body and a circuit integrated with the wax body. The circuit can be configured to break when the wax body melts.

In some implementations, a method of manufacturing an edible electronic device can include etching a pattern onto a layer of conductive material to create a patterned layer of conductive material. The pattern on the patterned layer of conductive material can define a circuit, an antenna, or another conductive element. The method can include applying the patterned layer of conductive material to an edible medium. The edible medium can be in liquid form. The method can further include solidifying the edible medium and patterned layer of conductive material to create an edible electronic device. The edible electronic device can include the circuit integrated with the edible medium and wherein the edible medium is in solid form. The edible electronic device can include chocolate electronics configured to destroy data contained in a circuit through digestion.

In some implementations, an edible electronic device can include an edible medium. A conductive trace can be integrated with the edible medium. The conductive trace can include an etched layer of edible conductive material. The device can include an edible binding agent disposed between the conductive trace and the edible medium.

In some examples, a glazing agent can be applied as an overlayer to the conductive trace to protect the conductive trace from mechanical damage.

Advantages of the disclosed techniques include at least the following. Transient electronics mitigate the sustainability issues caused by more permanent electronics. The post-product of the device remains in the intended environment without causing harm to the environment. Any harmful materials used for manufacturing the transient electronics can be collected and reused. In some examples, the transient electronics can enhance their environment when destroyed, such as an edible device that, when digested, provides nutrition to a person. The disclosed devices can be formed from inexpensive, accessible materials.

The disclosed devices can be recycled by re-obtaining the device materials and re-processing them into new devices. The devices can be re-configurable, from small shape changes (e.g., shrinkage or expansion functions as a volume sensor) to entire device re-shaping (e.g., changing from one type of sensor to another type of sensor both functionally and physically).

Systems built with transient materials can be configured to be destroyed naturally or on-demand in order to sanitize stored data. In biomedical applications, bio-compatible materials can allow implantable monitoring systems with designed transiency for short-term to long-term health monitoring. In sensing applications, transient sensors can leverage the environmental stimuli as both sensor triggers and a solution to retrieval challenges (e.g., water sensing that both activates and destroys the sensor).

As used herein, the term "about" means+/−10% of any recited value. As used herein, this term modifies any recited value, range of values, or endpoints of one or more ranges.

As used herein, the terms "top," "bottom," "upper," "lower," "above," and "below" are used to provide a relative relationship between structures. The use of these terms does not indicate or require that a particular structure must be located at a particular location in the apparatus.

Other features and advantages of the present disclosure will be apparent from the following detailed description, the figures, and the claims.

BRIEF DESCRIPTION OF THE DRAWINGS

FIG. 9 is a magnified view of the transient electronic device of FIG. 4.

FIG. 10 is a magnified view of the transient electronic device of FIG. 4 after being exposed to water.

FIG. 11 is a graphical representation of change in resistance over time for the transient electronic device of FIG. 4 after the transient electronic device is exposed to water.

DETAILED DESCRIPTION

The present disclosure describes methods for manufacturing transient electronics that are end-of-life-sustainable. End-of-life sustainable electronics described herein can create little or no landfill waste, can be advantageous in remote environments, or useful for applications in which it is desirable for the electronic device to disappear completely. In some examples, the function of the electronic device (e.g., sensor, heater, capacitor, inductor, etc.) is intrinsically connected with the electronics' sustainable end-of-life. For example, the process of breaking a circuit of a transient electronic device (e.g., by completely or partially dissolving or melting the electronic device) can provide the function of the transient electronic device. In other examples, the transient electronic device is manufactured so that the electronic device can be re-shaped for reuse.

Figure 1:
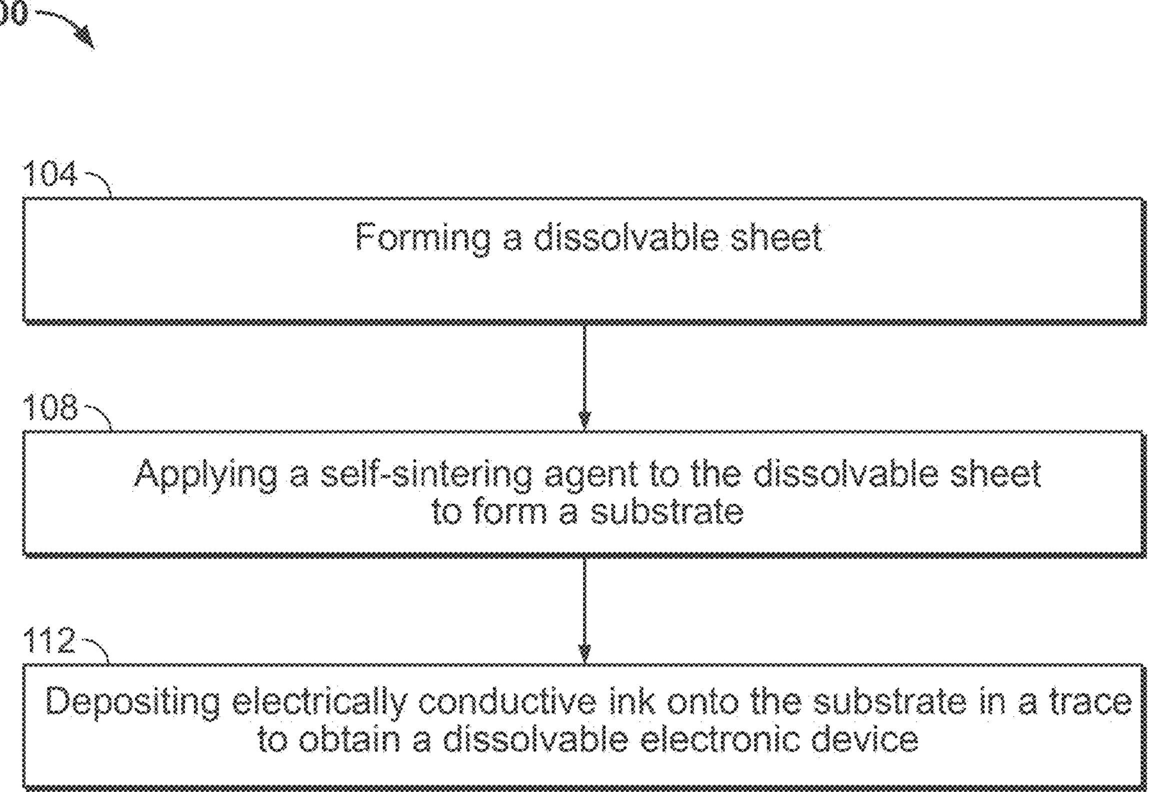
FIG. 1 is a flow chart of an example method of manufacturing a transient electronic device in accordance with the teachings of the present disclosure.

FIG. 1 is a diagram of a method or process 100 of manufacturing a transient electronic device in accordance with the teachings of the present disclosure. In one non-limiting example, the process 100 of FIG. 1 can be used to create a dissolvable and functional electronic trace using an additive manufacturing machine, an inkjet printer, or any combination thereof.

Step 104 of the process 100 involves forming a dissolvable sheet. In some examples, the dissolvable sheet is formed in an additive manufacturing operation. Additive manufacturing operations include manufacturing operations in which an object is created by building the object one layer at a time. Additive manufacturing can include using computer-aided-design (CAD) software and/or 3D object scanners to create a design for an object. Software then translates the design into a layer-by-layer framework for an additive manufacturing machine (e.g., a three-dimensional printer) to follow. A three-dimensional printer can be, for example, a fused deposition modeling printer, a stereolithography printer, a digital light processing printer, a selective laser sintering printer, a selective laser melting printer, a laminated object manufacturing printer, or a digital beam melting printer.

Manufacturing instructions are sent to the additive manufacturing machine, which includes hardware that deposits material, layer upon layer, in precise geometric shapes to create the object. In some examples, forming a dissolvable sheet can include providing one or more materials for the dissolvable sheet to a three-dimensional printer device, and providing instructions to the three-dimensional printer device to prepare the dissolvable sheet. In some examples, a nozzle of the additive manufacturing machine lays successive layers of material on top of each other until the final product is complete. Additive manufacturing can be used to create complex 3D entities. Making the dissolvable sheet using additive manufacturing techniques therefore allows the dissolvable sheet to be made with complex shapes, such as having different thicknesses for different portions of the sheet.

In some examples, a hydrographic sheet, or film, is formed by three-dimensionally ("3D") printing a customized sheet with variable thicknesses and/or two-dimensional shapes made of a water-soluble material. The sheet is formed by depositing a layer of solidifiable water-soluble material to form the sheet. Based on the dissolvability rate of the water-soluble sheet, the process 100 can involve selecting a rate of dissolvability of the sheet, and determining a thickness corresponding to the selected rate. The process 100 can include depositing the solidifiable water-soluble material to form the sheet at the selected thickness, such that the sheet has the selected rate of dissolvability.

The sheet is formed from a water-soluble material. In some examples, the water-soluble material is a synthetic polymer, such as polyvinyl alcohol ("PVA"), which dissolves in water. PVA composites that can be used are LulzBot® natural PVA, AquaSys® 120 PVA, and 3D Solve PVA, which have varying rates of dissolvability. In some examples, the sheet is a hydrographic film including a PVA printing layer and a Polyethylene terephthalate (PET) backing. In some examples, the backing of the hydrographic film is removed after printing the circuit pattern, and prior to dissolving the device.

In some applications, the sheet can be customized to dissolve at different rates in certain areas or sections of the sheet. In this example, step 104 can involve selecting a first rate of dissolvability for a first portion of the sheet, and a second rate of dissolvability for a second portion of the sheet. Step 104 can involve determining a first thickness that corresponds to the first rate of dissolvability and a second thickness that corresponds to the second rate of dissolvability. Step 104 can involve depositing one or more layers of solidifiable water-soluble material to form the first portion of the sheet having the first thickness and depositing one or more layers of solidifiable water-soluble material to form the second portion of the sheet having the second thickness. The first rate of dissolvability can be different from the second rate of dissolvability, and therefore the first thickness can be different from the second thickness.

In some examples, a dissolvable sheet can be obtained or formed through methods other than additive manufacturing. For example, a commercially available dissolvable sheet can be obtained, having the desired thickness or thicknesses. In some examples, multiple dissolvable sheets can be stacked together. The stacked dissolvable sheets can be adhered to each other, for example, using epoxy such as silver epoxy.

After forming the dissolvable sheet, step 108 of the process 100 optionally involves applying a self-sintering agent to the dissolvable sheet to form a substrate. For example, the dissolvable sheet printed by a three-dimensional printer can be coated with a self-sintering agent to create a self-sintering substrate. In some examples, aluminum-oxide, silicone oxide, or any combination thereof, are applied to one or more surfaces of the sheet. The self-sintering agent can be applied, for example, by painting, spray, three-dimensional printing, ink jet printing, screen printing, sponge or absorbent material application, or any combination thereof.

In some examples, a self-sintering sheet can be obtained or formed through methods other than by applying a self-sintering agent to the dissolvable sheet. For example, a commercially available self-sintering sheet can be obtained, such as a PET sheet, photo paper, and hydrographic film.

After applying the self-sintering agent, the self-sintering substrate is ready for step 112 of the process 100, which involves depositing electrically conductive ink onto the substrate in a trace to obtain the transient electronic device, which in this example is a dissolvable electronic device. The conductive ink reacts with the self-sintering coating to adhere to the substrate. Printed traces can become conductive within approximately one minute or less, though the conductivity slightly increases with time as the chemical sintering continues.

In accordance with this process 100, a number of different types of dissolvable, self-sintered electronic traces can be created that dissolve or disappear in water. Additionally, step 112 of the process 100 can be customized to create a particular shape and design to define a particular type of circuit. Depositing the electrically conductive ink onto the substrate can include printing one or more layers of the electrically conductive ink onto the substrate with an inkjet printer. In some examples, depositing the electrically conductive ink onto the substrate can include applying the electrically conductive ink by painting, stencil, sponge or absorbent material application, screen printing, three-dimensional printing, or any combination thereof.

Figures 2, 3, 4, 5:
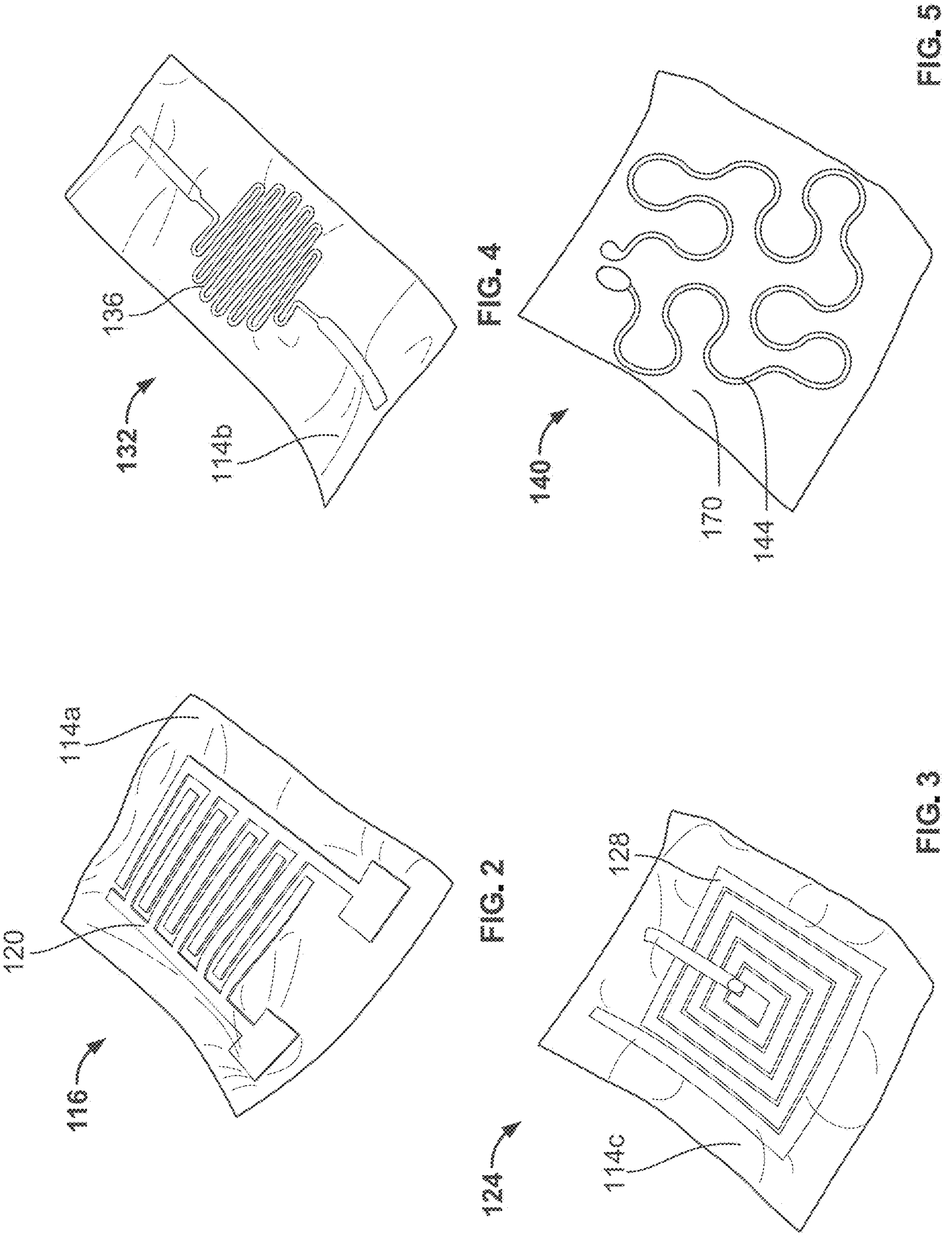
FIG. 2 is an example transient electronic device manufactured in accordance with the method of FIG. 1.
FIG. 3 is another example transient electronic device manufactured in accordance with the method of FIG. 1.
FIG. 4 is yet another example transient electronic device manufactured in accordance with the method of FIG. 1.
FIG. 5 is another example transient electronic device coupled to a layer of fabric and manufactured in accordance with the method of FIG. 1.

For example, step 112 of the process 100 can include printing the conductive ink onto the self-sintering substrate in a design that will create a circuit. In FIG. 2, a transient electronic device 116 has a circuit 120 printed on a substrate 114*a* and designed to form a single-layer capacitor. In FIG. 3, a different transient electronic device 124 has a circuit 128 printed on a substrate 114*c* and designed to form a two-layer inductor that is interconnected with silver epoxy. In FIG. 4, yet another transient electronic device 132 has a circuit 136 printed on a substrate 114*b* and designed to form a serpentine-based heater; and in FIG. 5, a transient electronic device 140 has a circuit 144 designed to form a sensor. Referring to FIG. 5, the circuit 144 is supported by a fabric layer 170. The layer 170 can include, for example, a super-porous hydrogel-embedded fabric.

As shown in FIGS. 2-5, the dimensions and design of the printed circuit can vary according to the application of the transient electronic device. In some examples, the circuit is designed to form a passive wireless circuit. The passive wireless circuit can be, for example, an antenna.

Step 112 of the process 100 can also be customized to provide a circuit with a desirable conductivity. For example, step 112 can involve printing one or more layers of conductive ink to result in a particular conductivity. In some examples, step 112 includes selecting a conductivity of the trace, determining an amount of conductive ink that corresponds to the selected conductivity, and depositing the determined amount of conductive ink onto the substrate in the trace, such that the trace has the selected conductivity. The printed circuits can then be destroyed when the sheet dissolves in water.

Figure 6:
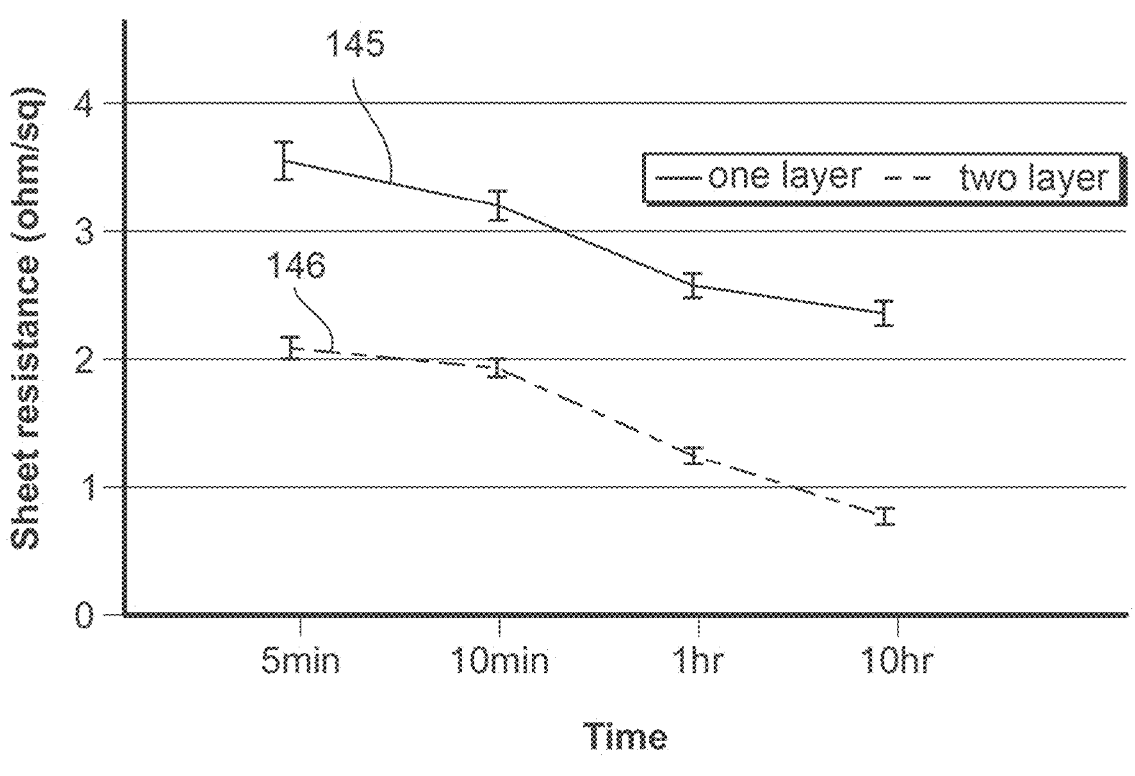
FIG. 6 is an example graphical representation of change in resistance over time due to self-sintering for two transient electronic devices manufactured in accordance with the method of FIG. 1, the two transient electronic devices having different amounts of conductive ink.

In FIG. 6, resistance in first and second printed samples are measured over time, where time is measured starting from the time when the conductive traces are created. The change in resistance over time is due to self-sintering of the traces onto the substrate. Self-sintering causes the conductivity of the traces to change over time after deposition. The first sample 145, with a single layer of printed trace, results in higher measurements of resistance over time compared to the second sample. The second sample 146, with two layers of printed trace, has a higher conductivity than the first sample and results in lower measurements of resistance over time compared to the first sample. Thus, step 112 of the process 100 can involve printing a certain amount of conductive ink, printing multiple layers, or both, in order to achieve particular conductivity and/or selected resistance over time.

A change in substrate thickness causes a change in the dissolving time of the transient device. In an example, a printed circuit on a thirty micron thick hydrographic film can be implemented as a one-time use sensor with uniform dissolvability taking around eighty seconds to dissolve when submerged in water. As described above with reference to step 104 of FIG. 1, thickness of a substrate can be increased or decreased through various methods. For example, thickness can be increased by printing a greater amount of material and/or a greater number of layers using an additive manufacturing machine. In some examples, thickness can be increased by stacking multiple sheets to form the substrate.

Within the same water-soluble sheet, areas or sections of the substrate with different thicknesses will dissolve sequentially. The disappearance can be programmatic and enhance functionality in the destruction process; for example, so that a moisture sensor supported by a substrate having a different thickness in different areas can detect different amounts of water exposure.

Figures 7, 8:
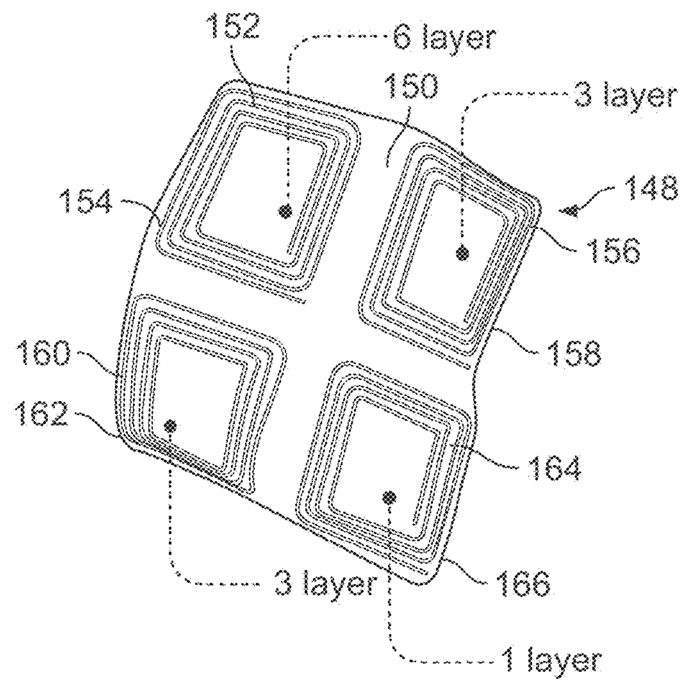
FIG. 7 is another example transient electronic device manufactured in accordance with the method of FIG. 1, the transient electronic device having multiple circuits supported by a substrate having different thicknesses.
FIG. 8 depicts the transient electronic device of FIG. 7 dissolving in water over time.

For example, referring to FIG. 7, a self-sintered, electronic trace 148 has four conductive traces or circuits printed in four different areas of a substrate 150. A first circuit 152 is located in a first area 154, a second circuit 156 is located in a second area 158, a third circuit 160 is located in a third area 162, and a fourth circuit 164 is located in a fourth area 166. The first area 154 of the substrate 150 is formed by printing six layers of solidifiable, water-soluble material; the second and third areas 158, 162 are formed by printing three layers; and the fourth area 166 is formed by printing one layer. In some examples, instead of or in addition to printing different numbers of layers in different areas of the substrate, the substrate 150 can be formed using one or more different types of PVA to achieve different dissolving rates.

The different circuits 152, 156, 160, 164 of the transient electronic device 148 become damaged sequentially based on the dissolvability of the area of the substrate 150 on which each circuit is printed. Specifically, the different thicknesses of the substrate dissolve at different rates. Therefore, the time to destroy each circuit is dependent on the thickness of the portion of the substrate supporting the circuit, with thicker substrates requiring a greater amount of time to dissolve.

Referring to FIG. 8, the transient electronic device 148 is placed in water, exposing each of the circuits 152, 156, 160, 164 to water at the same time. The circuits 152, 156, 160, 164 dissolve at different rates over time, depending on the number of layers of solidifiable water-soluble material (i.e., thickness of the substrate). Specifically, the fourth area 166, having the least thickness of substrate, dissolves first, the second and third areas 158, 162, having greater thicknesses than the fourth area 166, dissolve next, and the first area, 154, having the greatest thickness, dissolves last. Thus, the fourth circuit 164 is destroyed first, the second and third circuits 156, 160 are destroyed next, and the first circuit 152 is destroyed last.

In one non-limiting application, the transient electronic device 140 of FIG. 5 can be used as a water leakage sensor. FIG. 9 illustrates the water leakage sensor before being exposed to water, and FIG. 10 illustrates the water leakage sensor after being exposed to water and breaking in the water. The transient electronic device 140 is formed according to the process of FIG. 1, and is subsequently coupled to an absorbent layer 170 (e.g., sponge, hydrogel embedded fabric, etc.) to form a water leakage sensor. The layer 170 can be formed from any material or combination of materials that expand due to water or other stimulus. For example, the layer 170 can be formed from wood that expands when soaked in a liquid. In some examples, the layer 170 can be formed from a material that expands when exposed to heat. In this way, the device 140 can be implemented as a heat detection device for use in applications such as food containers.

In some examples, the transient electronic device 140 is connected to an electrical measurement device, e.g., through silver epoxy and two copper wires connected to the circuit. A micro-controller and voltage divider are connected to the circuit 144 through the wires.

In some examples, the transient electronic device 140 is a passive RF sensor. When the circuit is intact, the passive RF sensor is capable of reflecting a consistent back-scattered signal to a receiver. When the circuit degrades (e.g., after exposure to water), the reflected signal is modified and/or ceases. When the receiver detects the modified signal, or no signal at all, a processor in communication with the receiver can determine that the circuit is degraded, and therefore that a water leak has occurred. Such a passive RF sensor can enable water leakage detection in enclosed spaces, such as behind walls, in a roof, or within a sealed package.

The trace of the transient electronic device 140 includes printed one hundred twenty degree Peano curves. Peano curves enhance the stretchability of the device. The fabric layer 170 serves multiple purposes. First, after attaching the device to a pipe, the fabric slows down the leak by absorbing the water. Second, as the fabric absorbs the water and expands, the physical deformation will trigger a resistance change. Gradually, the water will pass through the fabric and dissolve the PVA sheet, increasing the trace resistance. In some examples, the substrate of the transient electronic device 140 is configured to dissolve when water passes through the absorbent fabric.

Referring to FIG. 9, the electronic trace 144 is continuous and undisrupted. When exposed to water, as shown in FIG. 10, the absorbent fabric layer 170 expands and stretches the printed circuit 144, gradually reducing the width of the circuit until it breaks. FIG. 11 illustrates the resistance of the transient electronic device 140 after being exposed to water over time. The measurement shown in FIG. 11 is the resistance from the conductive trace after exposure to water, providing a clear output signaling that water is present.

The resistance of the circuit 144 corresponds with the amount of water being absorbed by the fabric layer 170. As the circuit 144 gradually becomes thinner and then breaks due to swelling of the fabric layer 170, the resistance gradually gets higher, thereby communicating an amount of water leakage, rather than just the presence of water. In this example, the resistance of the sensor 140 as it reaches the end-of-life signifies an amount of water leakage, and not just the presence of water. Thus, the end-of-life of the electronic device 140 (i.e., dissolving until break) is intrinsically related to the function of the water-leakage sensor 140. In some examples, when the resistance rises above a threshold 175 (e.g., a threshold resistance of 5 kohm), a processor in communication with the device 140 determines that the device 140 has been exposed to water, thereby detecting water leakage.

In some examples, the electronic device 140 can be covered with hydrographic materials that have relatively longer dissolve times compared to the substrate (e.g., high thickness PVA or additional layers of PVA) to avoid false triggers due to the inconsequential presence of water in normal circumstances. When the amount of water reaches a threshold level, the water penetrates the coverage PVA layer and dissolves the substrate.

Figure 12:
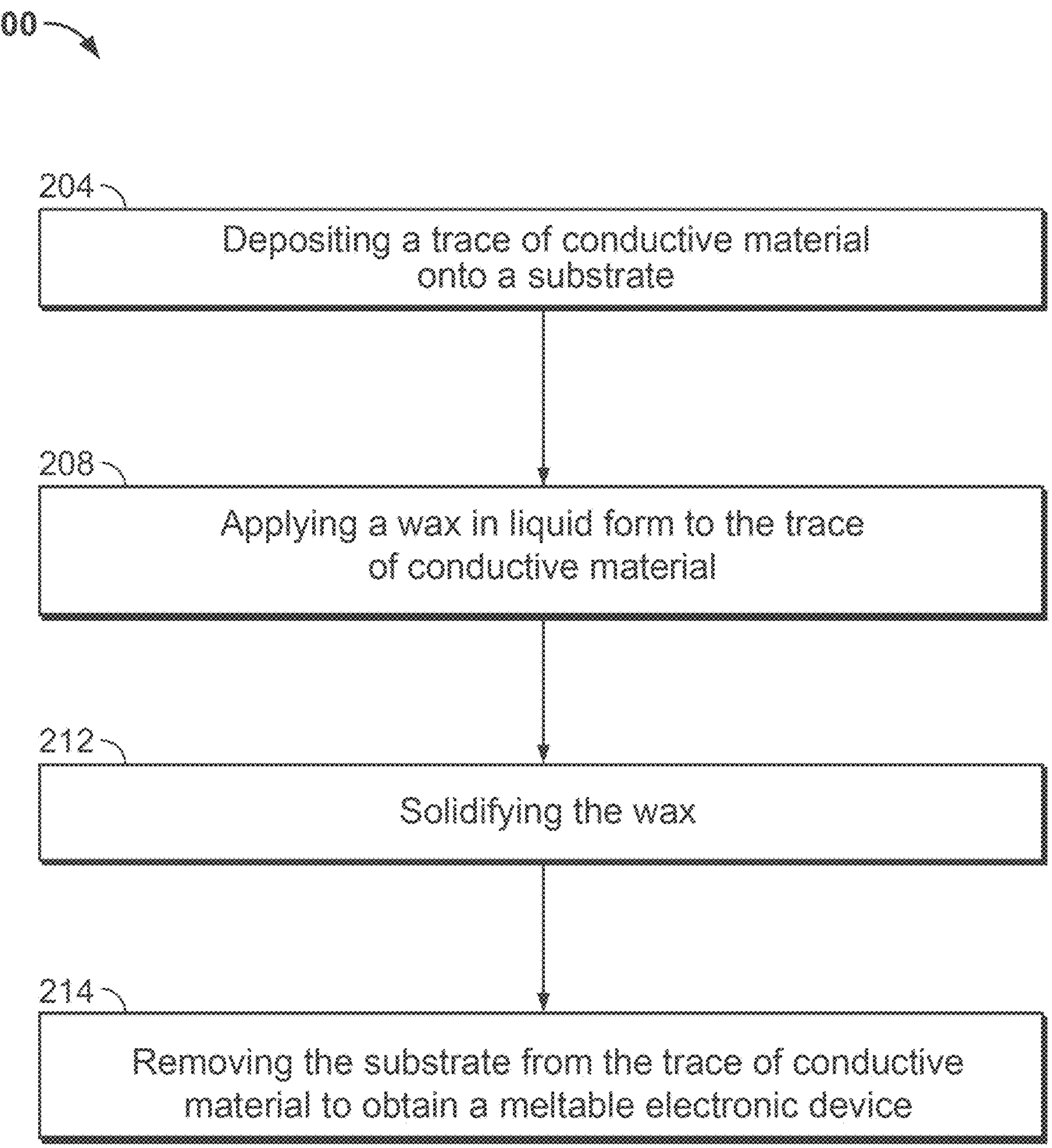
FIG. 12 is a flow chart of an example method of manufacturing a wax-based transient electronic device having a conductive trace in accordance with the teachings of the present disclosure.

FIG. 12 is a diagram of a method or process 200 of manufacturing a transient electronic device in accordance with the teachings of the present disclosure. The general process of FIG. 12 is described here, with additional details being provided with reference to FIG. 13. In the example process 200, wax is implemented as a substrate. Conductive traces are transferred to the wax. In non-limiting examples, the process 200 of FIG. 12 can be used to create a functional wax-based electronic device that becomes destroyed when melted. Step 204 of the process 200 involves depositing a trace of conductive material onto a substrate. Step 208 of the process involves applying a wax in liquid form to the trace of conductive material, step 212 involves solidifying or curing the wax, and step 214 involves removing the substrate from the trace of conductive material to obtain the transient electronic device, which in this example is a meltable electronic device.

Figure 13:
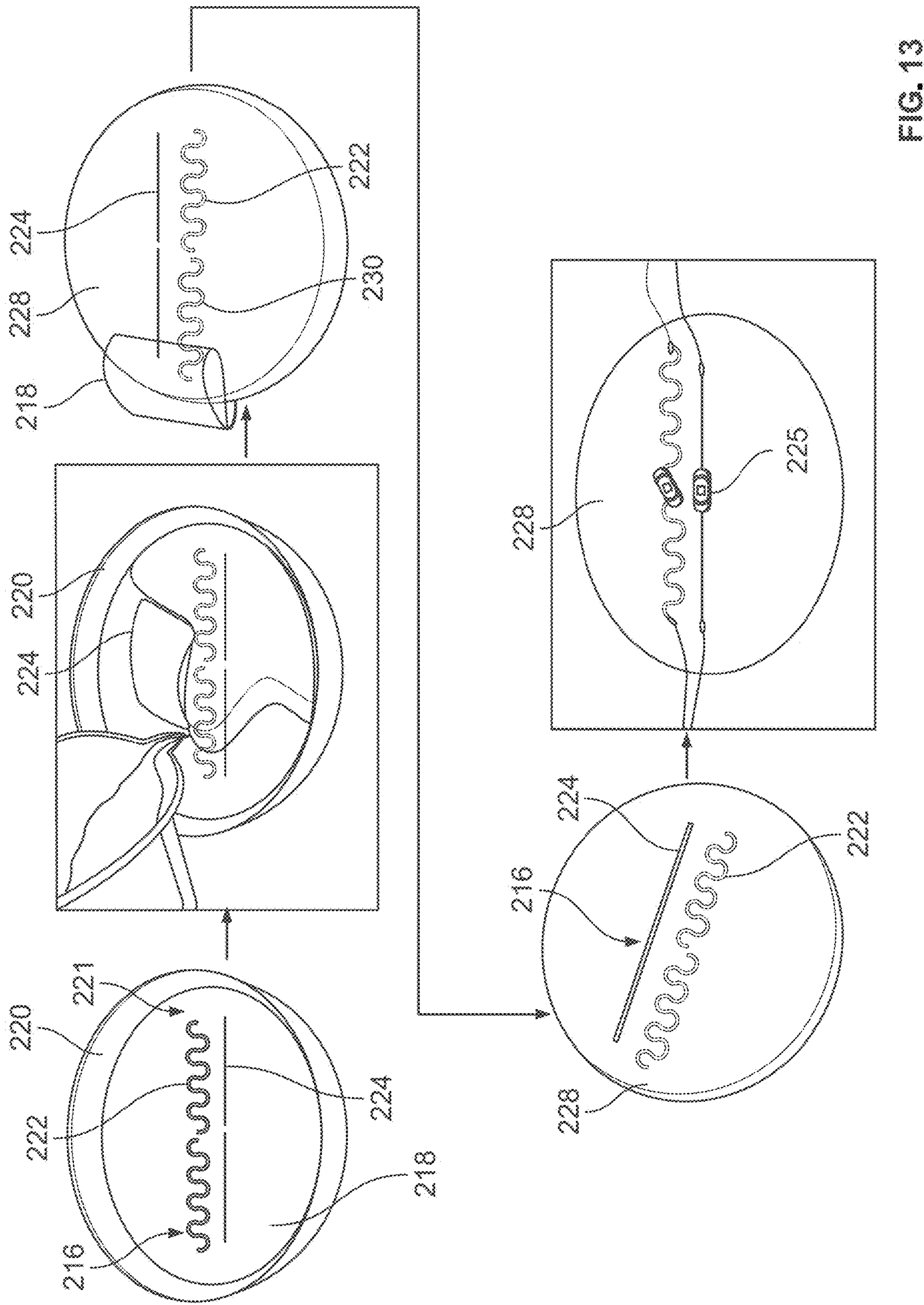
FIG. 13 is an example schematic diagram of the method of FIG. 12, showing steps of forming a wax-based sensor having a serpentine-printed circuit and a linear-printed circuit.

Referring to FIG. 13, a sequential diagram illustrates some of the stages of an example iteration of the process 200 of FIG. 12. In general, conductive traces are transferred to a wax substrate (e.g., by inkjet printing, screen printing, painting, spraying, or any combination of these). In some examples, to transfer the traces to the wax substrate, an inkjet printer can print conductive traces onto PET film. Melted wax is applied to the printed side of the film. For example, melted wax can be applied by being poured directly onto the printed side of the film, by using a dispensing system (e.g. industrial fluid dispensing systems), by spraying, by spinning, or by another thin film coating techniques. The melted wax is solidified, and the PET sheet is then removed, for example, by being peeled from the wax, by chemical processing, or by heating.

At step 204, a conductive trace 216 is printed on a substrate 218 (e.g., Mitsubishi HiTec paper) and then placed in a mold 220 with a first, printed side 221 facing up. In this example, a serpentine-printed circuit 222 and linear-printed circuit 224 are formed by printing conductive ink (e.g., silver nanoparticle ink) onto a self-sintering substrate 218. The mold can be formed through additive manufacturing or machining. The mold can be formed from, for example, silicone or metal.

As described above in step 208 of the process 200, wax is applied to the trace 216 by pouring liquid wax 226 into the mold 220 containing the substrate 218. In some examples, the liquid wax 226 is deposited into the mold 220 by an additive manufacturing machine. Thus, the wax is applied to the first side 221 of the substrate 218. In some examples, the wax is beeswax. Beeswax can be used due to being less harmful to the environment compared to other waxes, such as paraffin wax.

After step 212, a solidified wax-based medium and integrated electronic trace 228 are removed from the mold 220. In some examples, the wax is separated from edges of the mold, and the mold is flipped so that the wax exits the mold due to gravity. In some examples, the mold is cut away from the wax. In some examples, the substrate covers the bottom and sides of the mold, and the substrate, supporting the wax, is removed from the mold.

At step 214, the substrate 218 is removed from a second, opposite side 230 of the integrated electronic trace 228. For example, the substrate can be peeled off of the wax, chemically removed from the wax, or dissolved. In some examples, additional electronic components can be attached to the traces, such as light-emitting diodes (LEDs) 225. The additional components can be attached to the traces, for example, using conductive epoxy, silver paint, conductive tape, soldering, optical sintering methods, or any combination thereof. To attach the electronic components by soldering, the soldering is performed at a temperature low enough to not melt the wax. The additional electronic components can be removed and reused after the integrated electronic trace 228 is degraded or destroyed.

Figure 14:
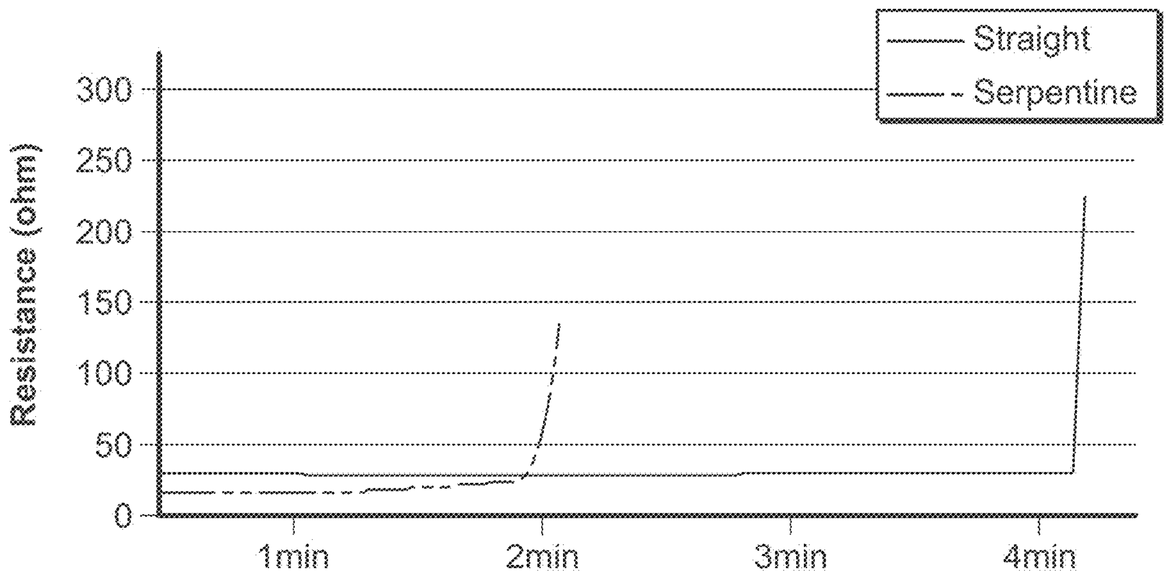
FIG. 14 is an example graphical representation of change in resistance over time of a straight wax-based sensor and of a serpentine wax-based sensor, as depicted in FIG. 13, as the sensors melt.

FIG. 14 is an example graphical representation 400 of change in resistance over time of a straight wax-based sensor and of a serpentine wax-based sensor, as depicted in FIG. 13, as the sensors melt. The graphical representation 400 illustrates the wax-based electronic device 228 while melting (i.e., during end-of-life). Specifically, resistance is measured for each of the serpentine-printed circuit 222 and linear-printed circuit 224 over time during melting. The graph of FIG. 14 illustrates that a longer amount of time is required to achieve an increase in resistance for the serpentine-printed circuit 222 than is required to achieve the increase in resistance for the linear-printed circuit 224. As shown in FIG. 14, the conductive traces remain stable until approaching the circuit's breaking point. At that point, the resistance rapidly increases. Serpentine traces with this approach can relieve the local stress concentration and make the circuit more stable. The serpentine design increases the endurance of the device before its cut-off point. Circuits with different paths and design therefore can require different amounts of time to be destroyed.

Figure 15A:
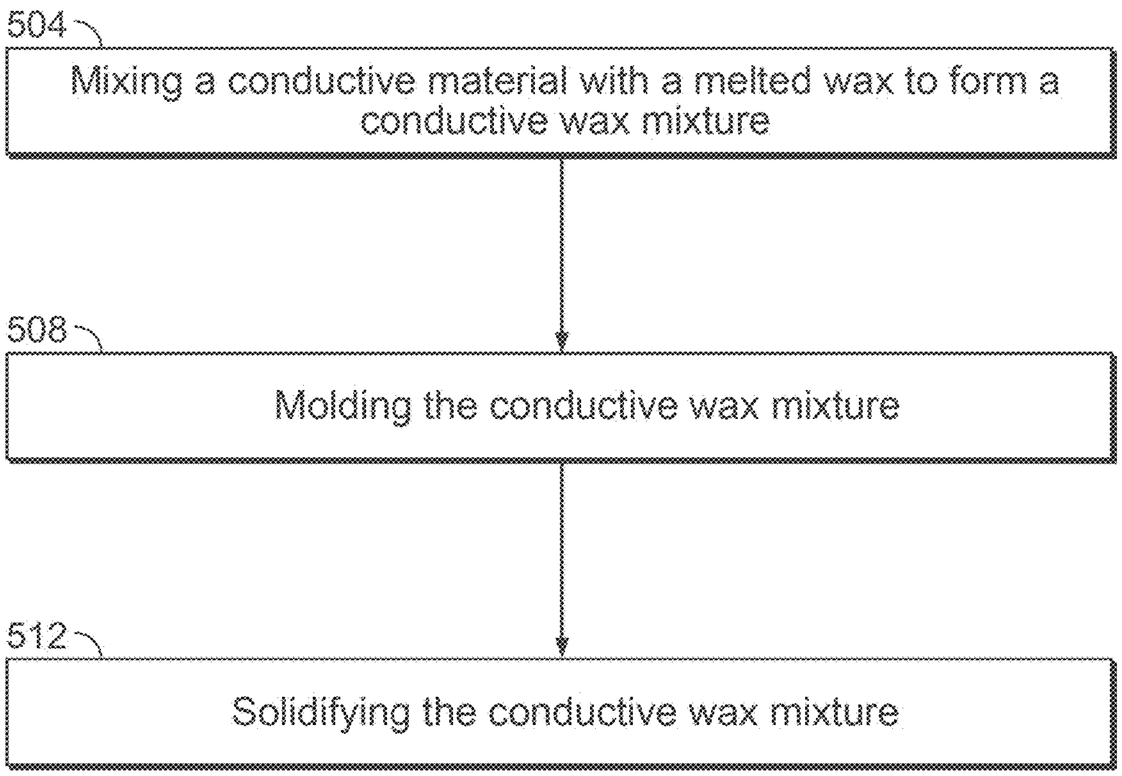
FIG. 15A is a flow chart of an example method of manufacturing a wax-based transient electronic device formed from a conductive mixture in accordance with the teachings of the present disclosure.

FIG. 15A is a diagram of a method or process 500 of manufacturing a transient electronic device in accordance with the teachings of the present disclosure. In general, conductive powder or particles are mixed with beeswax to form a composite material. The conductive powder or particles can include, for example, graphite powder, carbonized cotton powder, activated charcoal powder, metal nanoparticles, conductive polymers, semiconducting particles, quantum dots, or any combination of these). The conductive powder or particles are evenly mixable into a suspension. The general process of FIG. 15A is described here, with additional details being provided with reference to FIGS. 15B, 16, and 17. In non-limiting examples, the process 500 of FIG. 15A can be used to create a functional wax-based electronic device that becomes destroyed when melted. Step 504 of the process 500 involves mixing a conductive material with a melted wax to form a conductive wax mixture. Step 508 of the process 500 involves molding the conductive wax mixture into a selected shape, and step 512 involves solidifying or curing the conductive wax mixture to form a wax-based electronic device.

Figure 15B:
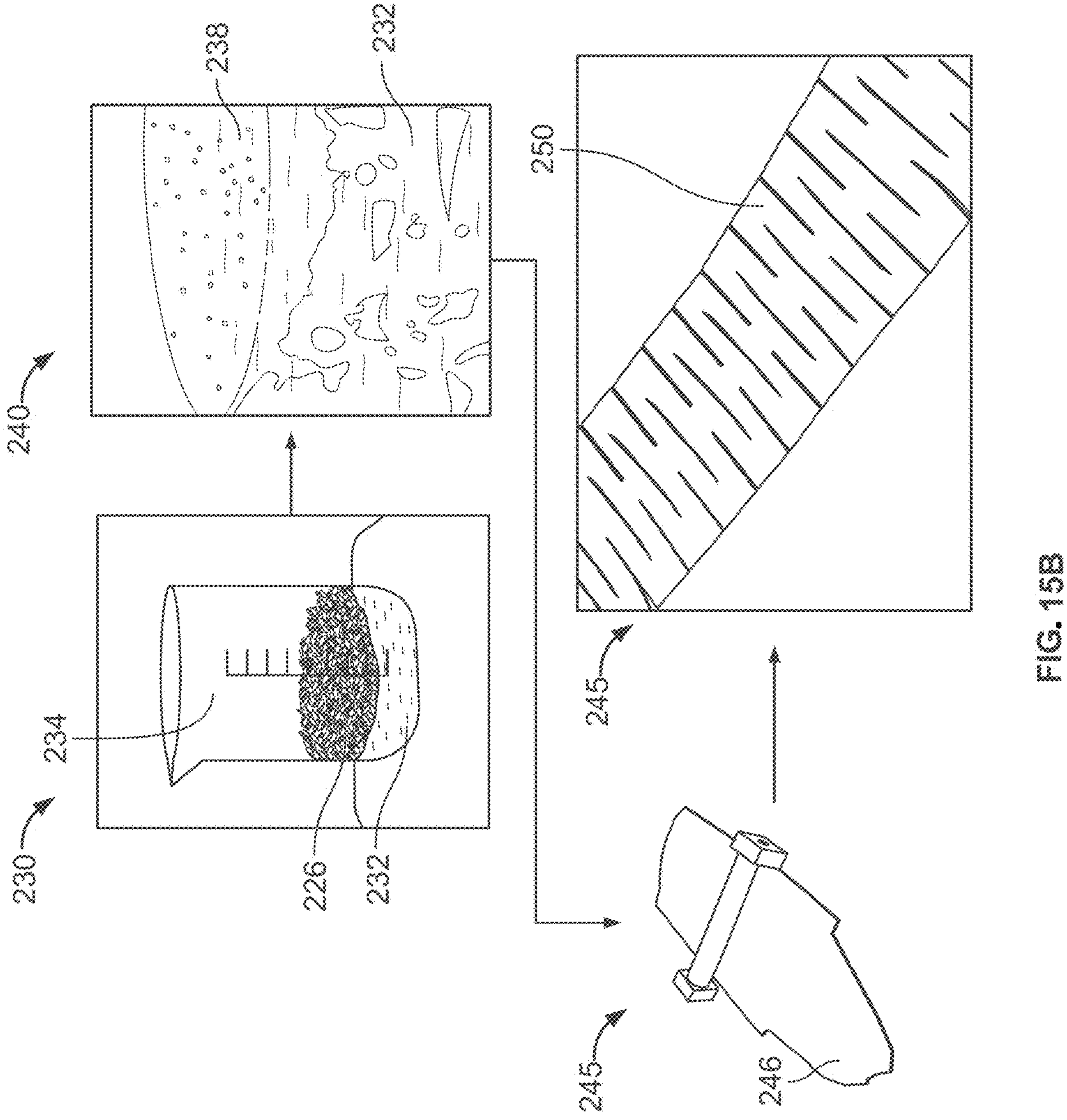
FIG. 15B is an example schematic diagram of the method of FIG. 15A, showing steps of forming a wax-based sensor with conductive material integrated into the wax.

In FIG. 15B, a sequential diagram illustrates example stages of the process 500 of FIG. 15A. At stage 230, solid wax 226 is melted to liquid wax 232 in a container 234. In an example, the solid wax is beeswax, and the beeswax is melted at approximately 75 C. The solid wax can be melted, for example, by a hot plate, an infrared heating device, an oven, a burner, or another heat source.

Step 504 of process 500, illustrated in stage 240 of FIG. 15B, involves combining a conductive material 238, such as powdered graphite, to the liquid wax 232. In some examples, the graphite powder is poured into the beeswax after the beeswax is melted. Particles of the graphite powder can have a size of approximately forty-four microns. The conductive material 238 is mixed with the liquid wax 232 to form a conductive wax mixture. In some examples, a magnetic stirrer is used to mix the beeswax and the graphite power (e.g., at a speed of 1000 rpm or less for thirty minutes). The stirring speed can vary for different graphite dosages.

The step 508 involves molding the conductive wax mixture. The wax can be molded into various shapes. In some examples, a film applicator (e.g., a 1000-micron film applicator) molds or forms the wax into a thin-sheet wax. For example, at stage 245, the conductive wax mixture is rolled or flattened by the film applicator into a flat layer of conductive wax composite 246. In some examples, the conductive wax mixture can be flattened to form a thin sheet having a thickness of ten millimeters or less (e.g., eight millimeters or less, five millimeters or less, three millimeters or less).

At stage 248, after the layer of conductive wax composite 246 is solidified at step 512, the conductive wax composite 246 is cut and/or folded to form a wax-based bending sensor 250, where a change in bending of the composite causes a change in electrical resistance across the composite. In some examples, the conductive wax composite 246 is cut (e.g., with kirigami cuts) to make the composite more flexible. Resistive changes can be read by a microcontroller connected to a voltage-dividing circuit connected to the conductive wax composite 246 in order to determine an amount of bending of the conductive wax composite 246.

Figure 16:
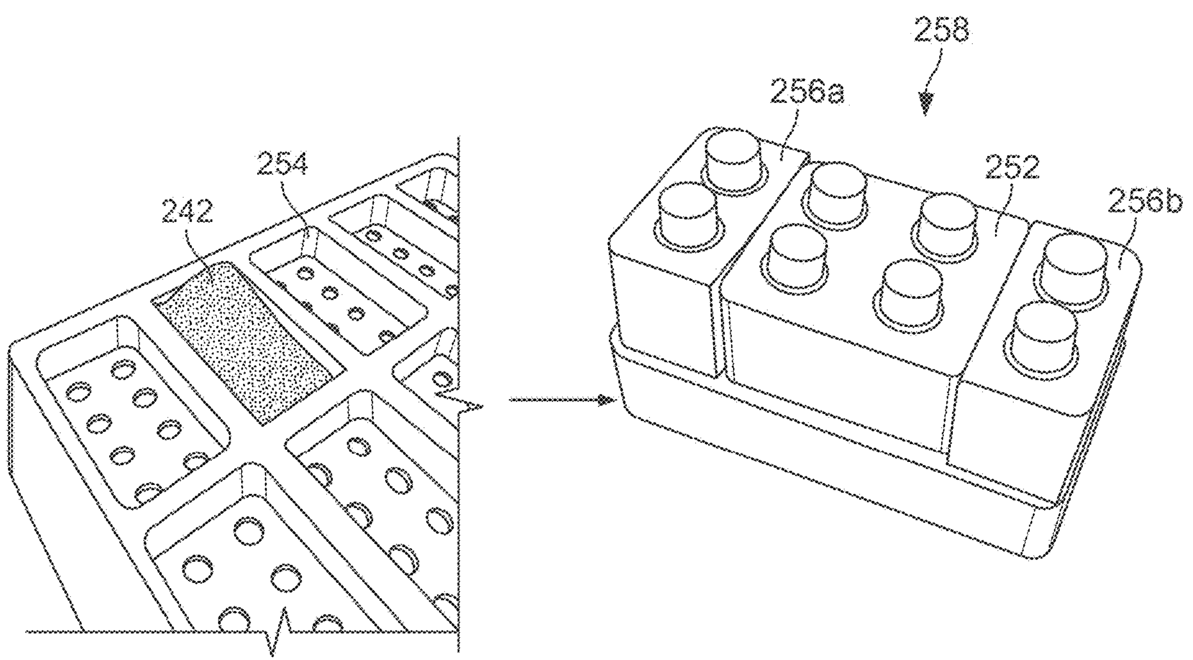
FIG. 16 is a partial schematic diagram of forming an example wax-based sensor in accordance with the method of FIG. 15A.

In FIG. 16, a partial sequential diagram of step 508 of a different example iteration of the process 500 of FIG. 15A is provided. Here, a conductive wax mixture 242, which can be created in the same or similar manner to that shown in FIG. 15B, is poured into a mold 254 (rather than flattened) to form a conductive wax-based electronic device. In the illustrated example, the mold 254 is shaped to create linkable brick-shaped wax-based components to form a wax-based LED circuit 258. The mold 254 can be formed through additive manufacturing or machining. The mold 254 can be formed from, for example, silicone or metal.

A center brick 252 is non-conductive, and an LED is embedded in the brick 252. Two conductive wax bricks 256*a*, 256*b* are arranged on opposite sides of the brick 252. An external power source is connected to the two conductive wax bricks 256*a*, 256*b*. The two conductive wax bricks 256*a*, 256*b* conduct current from the power source to the center brick 252, thereby causing the LED to illuminate.

Figure 17:
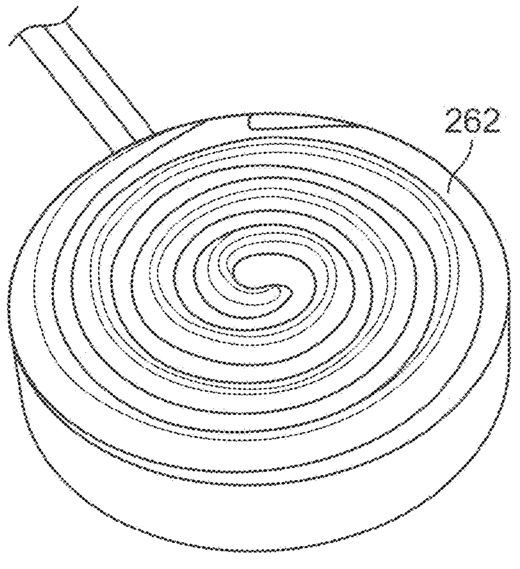
FIG. 17 is another example wax-based sensor manufactured in accordance with the method of FIG. 15A.

The conductive wax mixture can be shaped in many different forms to create different types of sensors and electronics. In FIG. 17, for example, the conductive mixture can be shaped and cast to form a disk, or button, with a raised spiral to form a capacitive touch sensor 262. In some examples, the capacitive touch sensor 262, including the spiral-shaped button, and the capacitive change can be measured by a microcontroller. A change in the touch area of the button causes a change in capacitance of the button. For example, the capacitance of the button changes when touch is applied to the button by a user, compared to when no touch is applied to the button.

In some examples, the composite can be melted down to create a different shaped electronic device. For example, the brick-shaped wax-based components of FIG. 16 can be melted down and reformed into the touch sensor 262. A capacitive touch sensor can be melted down and the material can be re-cast into a resistive bending sensor. Besides the compostable nature of beeswax and graphite, this recyclability feature adds additional sustainability to beeswax-based electronic devices.

The composition of the conductive wax mixture 242 can be customized to create a composite having a certain conductivity and/or resistance.

Figure 18A:
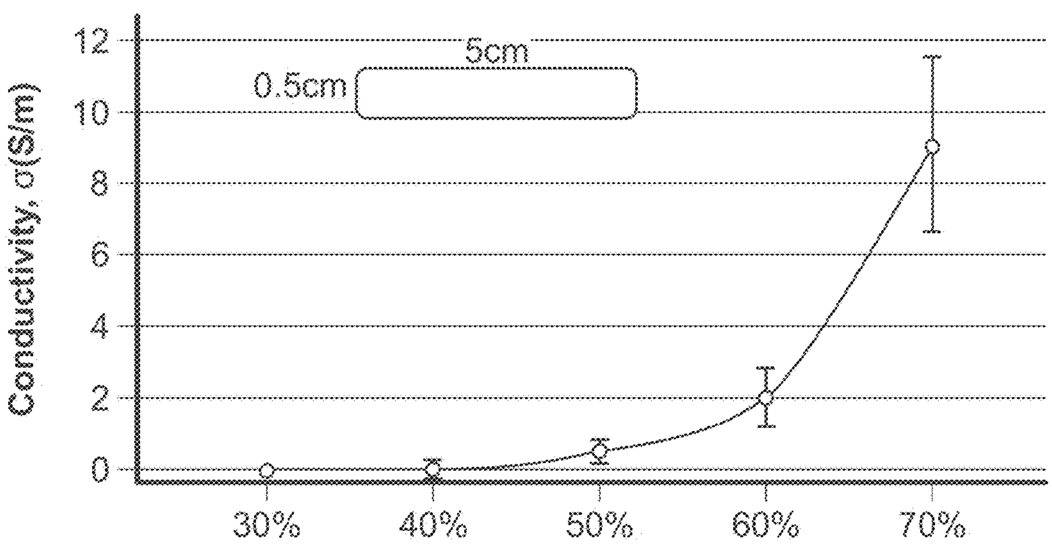
FIG. 18A is an example graphical representation of a relationship between conductivity and percent volume of conductive material of a wax-based sensor manufactured in accordance with the method of FIG. 15A.

FIG. 18A is an example graphical representation of a relationship between conductivity and percent volume of conductive material of a wax-based sensor manufactured in accordance with the method of FIG. 15A. The graph in FIG. 18A illustrates that conductivity of a 0.5 cm×5 cm conductive wax-based electronic device is directly related to a percent volume of conductive material of the wax-based electronic device. For example, higher amounts of graphite powder result in a more conductive composite.

Figure 18B:
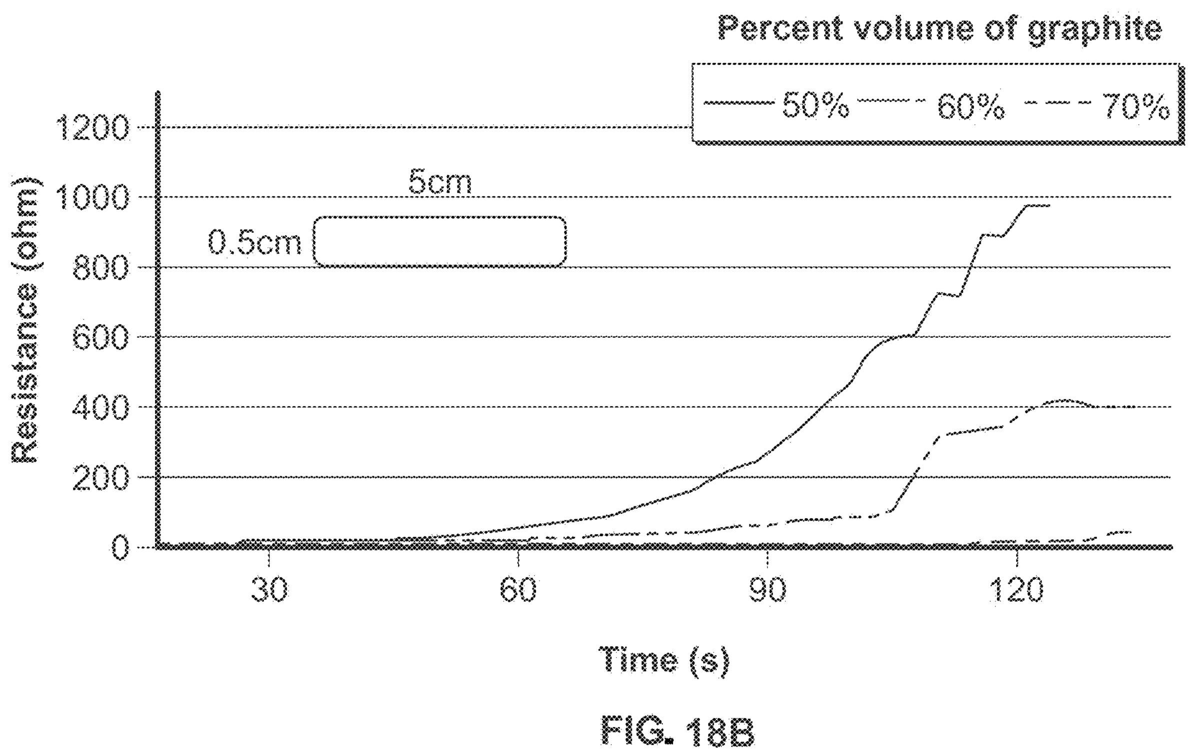
FIG. 18B is an example graphical representation of change in resistance exposed to heat over time for three sample wax-based sensors manufactured in accordance with the method of FIG. 15A.

FIG. 18B is an example graphical representation of change in resistance exposed to heat over time for three sample wax-based sensors manufactured in accordance with the method of FIG. 15A. FIG. 18B illustrates that lower percent volume of graphite results in increased resistance over time when heated, when compared to higher percentage volumes of graphite. Lower ratios of graphite yielded a higher final resistance and a steeper curve. Therefore, beeswax-graphite composite can be implemented as a thermistor, (e.g., a resistance thermometer, or a resistor whose resistance is dependent on temperature).

Figure 18C:
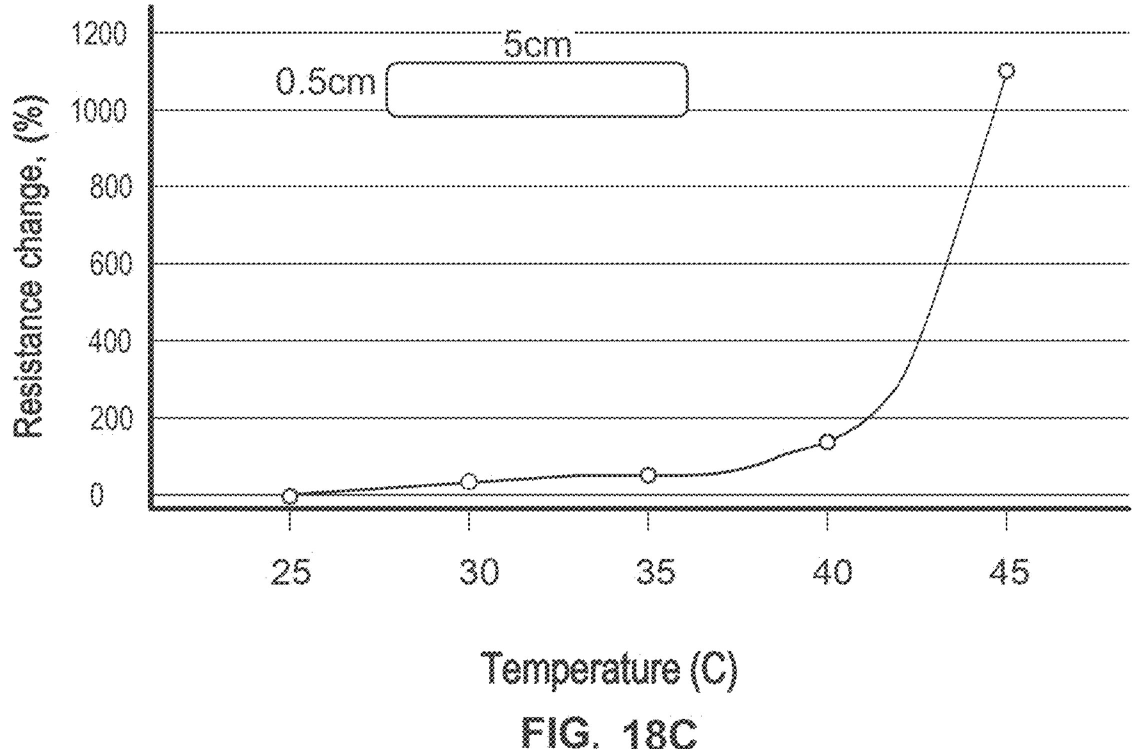
FIG. 18C is an example graphical representation of change in resistance under different heating temperatures.

A beeswax-graphite composite is sensitive to heat. FIG. 18C is an example graphical representation of change in resistance under different heating temperatures. The graph in FIG. 18C illustrates that resistance of a 0.5 cm×5 cm conductive wax-based electronic device is directly related to temperature. For example, higher temperatures result in a more resistive composite. The resistance of the composite increases with temperature across all graphite powder ratios.

As a result, the end-of-life of a wax-based electronic device can be customized in a variety of ways to create biodegradable sensors and circuits. By combining these approaches for making both highly conductive or more resistive beeswax, a self-destroying circuit configuration can be formed, as shown in FIG. 19.

Figure 19:
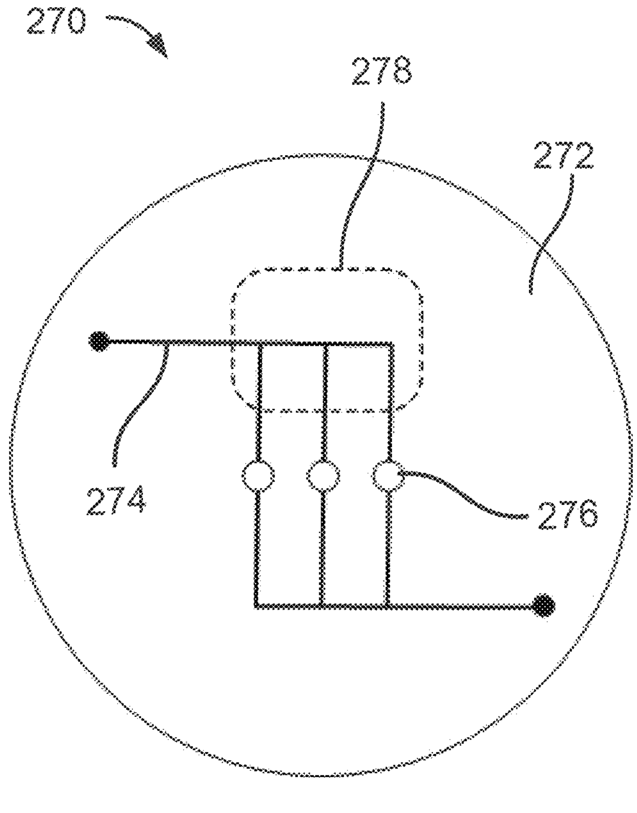
FIG. 19 is an example wax-based electronic device manufactured in accordance with the methods of FIG. 12 and FIG. 15A.

To form device 270 shown in FIG. 19, a silver nanoparticle trace 274 is printed, e.g., by an inkjet printer, onto the beeswax 272 to form a circuit according to the process of FIG. 12. The trace 274 connects to three LEDs 276. A piece of beeswax-graphite composite is formed according to the process of FIG. 15A. The beeswax-graphite composite is sealed inside the device 270, forming a heating element 278 shown with a dashed outline. Thus, the device 270 includes a conductive wax composite sealed inside a non-conductive wax structure. The graphite composite heating element 278 is configured to heat up when energized by a power supply (not shown), which can be internal or external to the device 270.

During operation of the device 270, the LEDs 276 are energized by the power supply through the circuit formed by the trace 274, and emit light. The power supply connected to the LEDs can be the same as the power supply connected to the graphite composite 278 or can be a different power supply.

As the heating element 278 in the device 270 heats up, the heating element 278 melts the surrounding non-conductive wax, melting the circuit and ultimately damaging the functionality of the circuit. As the device 270 melts, the circuit is damaged, and the LEDs are deenergized.

Figure 20:
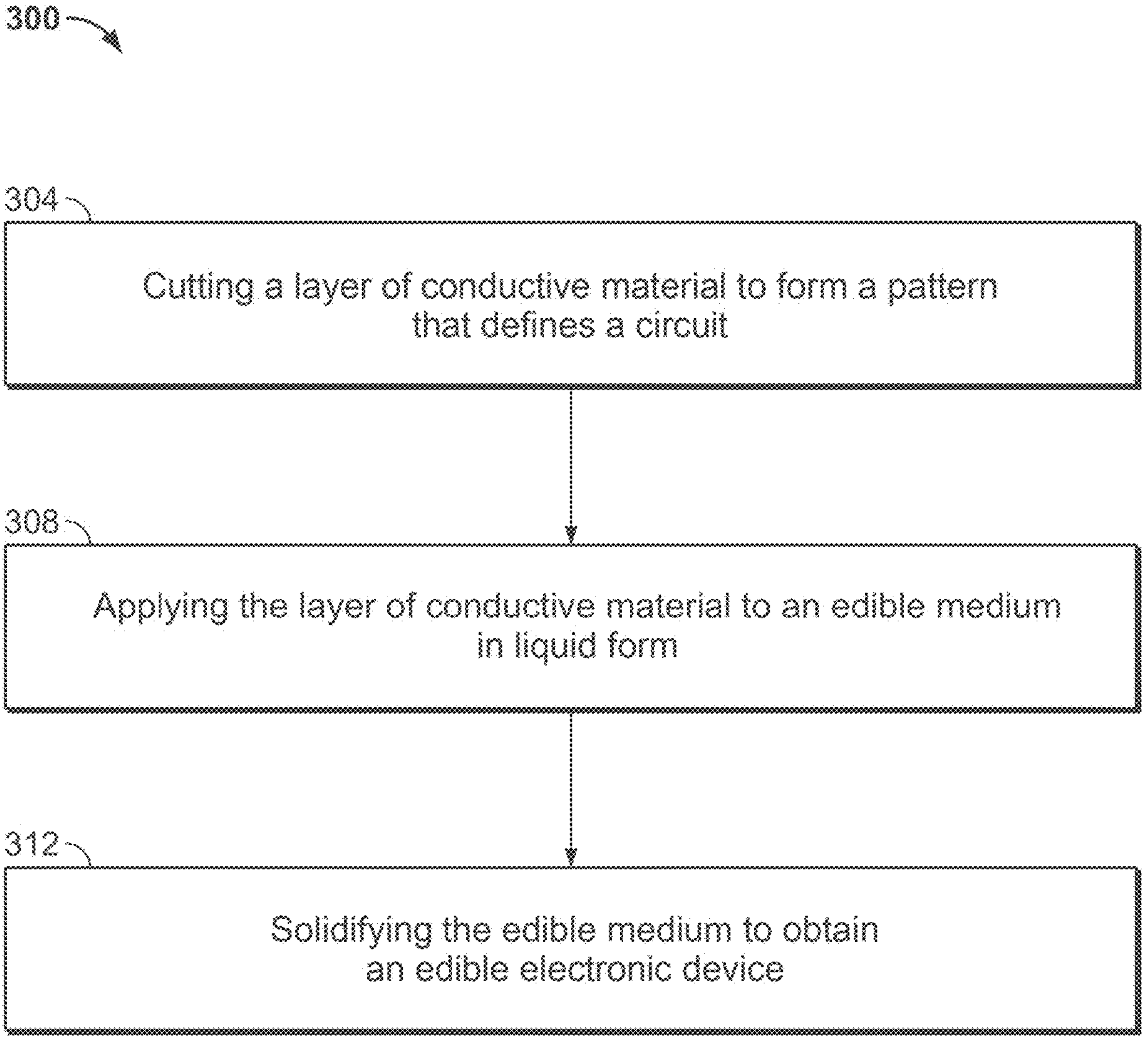
FIG. 20 is an example flowchart of a method of manufacturing an edible transient electronic device in accordance with the teachings of the present disclosure.

FIG. 20 is a diagram of a method or process 300 of manufacturing an edible transient electronic device in accordance with the teachings of the present disclosure. In non-limiting examples, the process 300 of FIG. 20 can be used to create a functional edible electronic device that becomes destroyed when eaten. The general process of FIG. 20 is described here, with additional details being provided with reference to FIGS. 21A and 21B.

Edible electronics can be destroyed through the destructive nature of the digestive process. In some examples, edible gold leaf can be used as an electrode material with 3D-printed chocolate for edible electronics, which can be used to destroy sensitive information stored on the electronics during digestion. Printed chocolate can contain identifiable information (e.g., access control with RFID) for users to obtain temporary access to areas, objects, or resource, which can be eaten and therefore destroyed when no longer needed.

Edible electronics can be destroyed or modified through means other than the digestive process. In some examples, an edible electronic device is sensitive to temperature, so that the signals received from the edible electronic device changes due to temperature changes.

In an example, an edible conductive trace is embedded in a rising baked good such as a loaf of bread. The conductive trace can transmit and/or reflect signals to a receiver. As the baked good heats up and changes shape (e.g., due to rising), the shape and/or size of the conductive trace changes, causing changes to the signals received by the receiver. Additionally, as the baked good heats up, material properties of the dough or batter around the conductive trace change, for example by becoming hotter and less dense. The change in the properties of the dough can cause changes in backscatter reflected from the conductive trace, which can cause changes to the signals received by the receiver. The changes in the signals (e.g., due to rising, due to change in material properties) can provide an indication of the readiness of the baked good, such as an indication of an amount of time needed for the baked good to finish baking. Therefore, a processor in communication with the receiver can determine, based on changes to the received signals from the edible electronic, when the baked good is finished baking.

In another, the conductive trace embedded in an edible medium can be configured to melt, freeze, or dissolve due to changing temperatures. As the edible medium changes temperature, the melting, freezing, or dissolution of the conductive trace can cause changes to the signals received by the receiver, and may cause the receiver to cease receiving any signal from the conductive trace. In an example, a conductive trace is configured to melt at a temperature that is around a target temperature for a food item. The receiver receives a signal from the conductive trace when the temperature is below the target temperature. When the food item reaches the target temperature, the conductive trace melts, and the receiver no longer receives the signal from the conductive trace. A processor in communication with the receiver can determine, in response to the receiver no longer receiving the signal, that the conductive trace has melted and the food item has reached the target temperature.

In some examples, the conductive trace (e.g., gold leaf or silver foil) can be applied to flat chocolate and then a food three-dimensional printer can print shapes on top of the conductive trace (e.g., to hide the conductive trace). In some examples, food mold-casting can be used to construct the electronics-embedded chocolate.

Step 304 involves cutting a layer of conductive material to form a pattern that defines a circuit. The patterned layer of conductive material defines a circuit that will be integrated into the edible electronic device. Step 308 involves applying the layer of conductive material to an edible medium in liquid form. Step 312 involves solidifying the edible medium to obtain an edible electronic device. The circuit is integrated with the edible medium when the edible medium solidifies.

In some examples, a glazing agent can be applied as an overlayer to the layer of conductive material to protect the conductive material from mechanical damage. For example, the conductive trace can be protected from mechanical damage through spray application of an edible shellac glazing agent. The glazing agent can reduce the likelihood of the conductive trace flaking off of the edible electronic device. An example glazing agent is Glazing Agent (904), which can be used to add a glazed surface to foods. Glazing Agent (904) can also be referred to as Shellac.

Figure 21A:
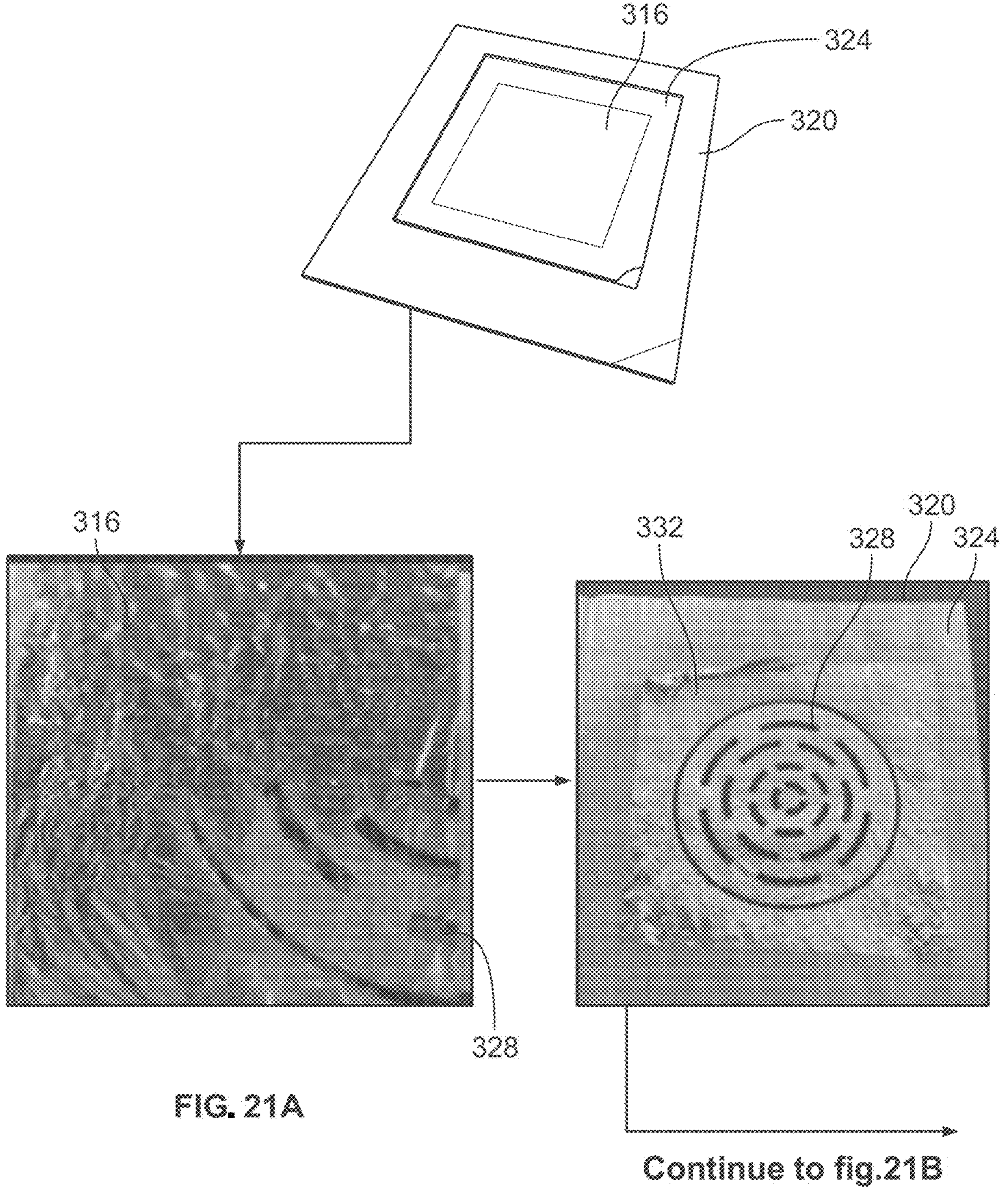
FIG. 21A is a partial schematic diagram of forming a transient electronic device in accordance with the method of FIG. 20.

Referring to FIG. 21A, a partial sequential diagram illustrates some of the stages of an example iteration of the process 300 of FIG. 20. Before step 304, a layer of conductive material 316 is coupled to a first substrate 320. The first substrate 320 can be, for example, a substrate that is suitable for insertion into a laser cutter. The first substrate 320 maintains the conductive material flat during the fabrication process. In some examples, the first substrate 320 is a PET sheet. In some examples, the layer of conductive material is adhered to the first substrate 320 with water. In the example of FIG. 21A, the layer of conductive material 316 is a sheet of edible gold foil. Other edible materials, such as silver leaf, magnesium, zinc, iron, vegemite activated charcoal, and carbonized cotton can be used. The layer of conductive material 316 can be placed under a protective sheet 324 (e.g., a sheet of tissue paper 324).

A first side of the gold foil is coupled to the first substrate 320. The first side of the gold foil 316 is placed on a wetted surface of the first substrate 320, which can be a transfer paper. The surface of the first substrate 320 can be wetted with a releasing agent, for example, water, to help release the first substrate from the conductive foil at a later stage in the process 300.

Step 304 involves cutting the layer of conductive material to form a pattern to define a circuit. In some examples, step 304 includes etching, by laser cutting, a design 328 into the gold foil 316. In some examples, the laser cutter directly vector-cuts the contour of the design. In some examples, the laser cutter engraves away scrap material, leaving the pattern of gold foil remaining. For example, the first substrate 320 supporting the layer of conductive material 316 can be inserted into a laser cutter. The sheet of tissue paper 324 and scrap foil 332 is removed from a second side of the foil, the second side being opposite the first side.

Figure 21B:
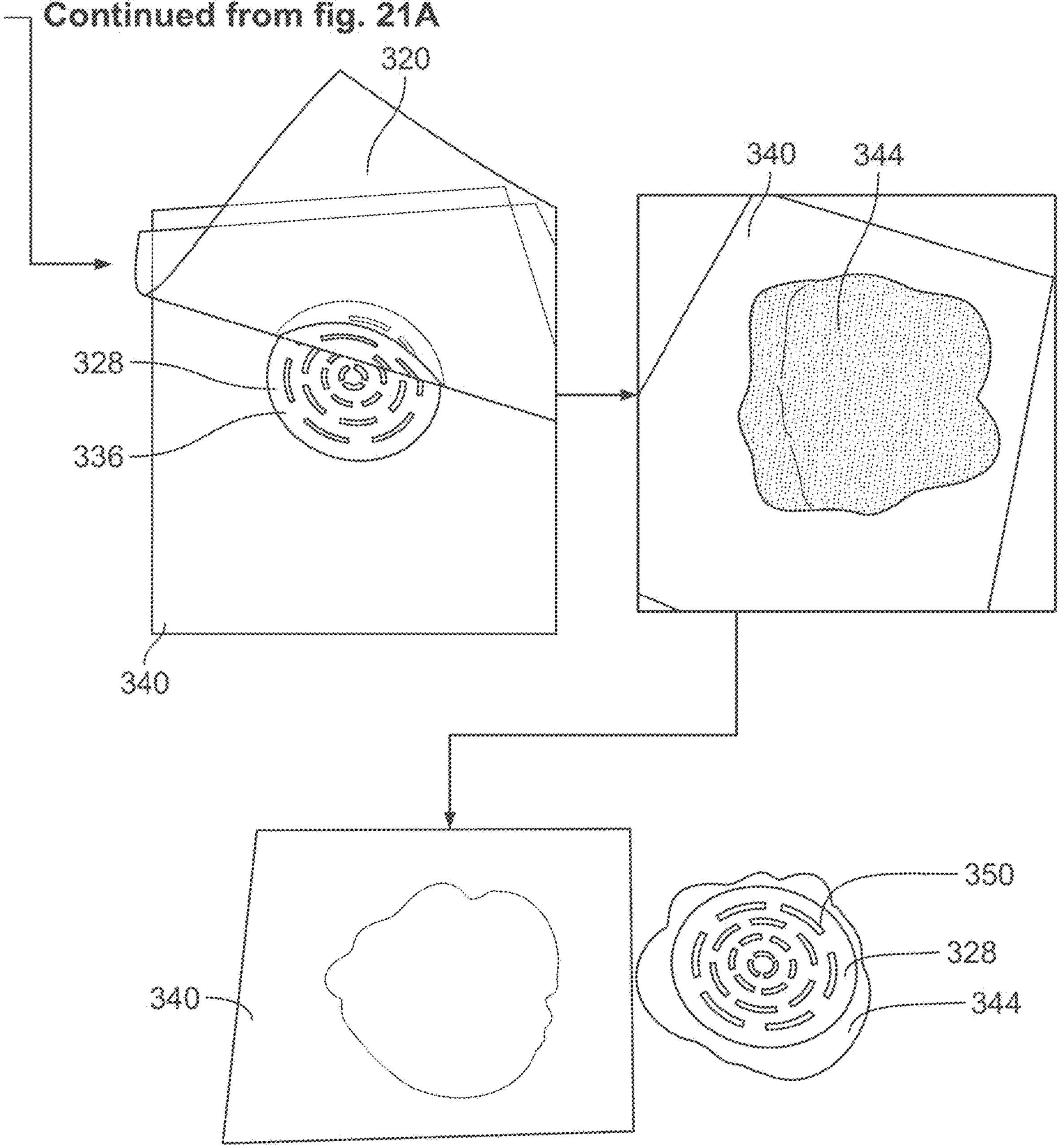
FIG. 21B is a partial schematic diagram of forming the transient electronic device continued from FIG. 21A.

Turning to FIG. 21B, the second side 336 of the patterned layer of foil 328 is placed against an edible substrate 340. The edible substrate 340 can be, for example, sugar paper. In some examples, the edible substrate 340 is coated with an edible adhesive, such as a spray glaze. The first substrate 320 is removed from the first side of the gold foil 316 and from the edible substrate 340, leaving the patterned gold foil coupled to the edible substrate 340.

Step 308 involves applying the gold foil to the edible medium 344. For example, the first side of the gold foil can be contacted with the edible medium 344. In some examples, applying the gold foil to the edible medium 344 include putting a melted edible medium 344, such as chocolate, on the first side 336 of the patterned foil 328 and on the edible substrate 340.

Other edible mediums can be used. Examples of edible mediums include caramel, cake, pie crust, bread, solid candy, gummy candy, and cheese. In some examples, the conductive material can be applied to dough or batter used to make a baked good such as bread, a pie crust, a muffin, a cupcake, a pancake. The conductive material can be applied to the dough or batter prior to baking, during baking, or after baking. The conductive material can be applied to the edible medium when the edible medium is in liquid, solid, or semi-solid form. The surface of the edible medium to which the conductive material is applied can be a flat surface or a non-flat surface, such as a curved surface.

When the edible medium 344 has cooled and solidified at step 312, the edible substrate 340 can be removed from the edible medium 344. For example, the solidified chocolate can be peeled off of the sugar paper. Thus, the edible substrate 340 is removed from the solidified edible electronic device 350, leaving the patterned foil 328 integrated with the solid chocolate edible medium 344. On-demand eating and digesting the electronic device 350 will physically destroy the data stored within the system.

In some examples, the melting point of the edible medium is tuned to environment-specific temperatures. Tuning the melting point to a higher temperature can reduce the likelihood of false triggers. For example, different types of chocolate have different melting points (e.g., a dark chocolate medium will likely having a higher melting point than a milk chocolate medium). An edible medium with a lower melting point can be chosen to increase sensitivity, while an edible medium with a higher melting point can be chosen to decrease sensitivity and reduce the likelihood of false triggers.

Different edible conductive patterns formed on chocolates can be used to encode different information. For example, different patterns can have different resistances encoded to provide various types of information. Example patterns can include a circular pattern or a wavy pattern. In an example, a computing device stores data tables associating resistance values to numbers of calories. A pattern of conductive material on an edible medium has a particular resistance. The resistance can be read (e.g., by a microprocessor) across the pattern and provided as input to the computing device. The computing device can access the data tables to determine the number of calories in the edible medium. Similarly, computing devices can store data tables associating electrical characteristics, such as resistance, to other information about the edible medium, such as a flavor of the edible medium.

In some examples, electrical characteristics of the circuit can be used to determine how much of the edible medium remains. For example, when a circuit on a piece of chocolate is broken, it can indicate that the chocolate has been eaten in whole or in part. The trace changes as bites are taken, which predictably changes the resistance, such that resistance measured across the trace corresponds to the amount of the chocolate that has been eaten. This can be extended to detect how much of the chocolate remains. Electrical characteristics of the circuit can be measured by electrical measuring devices such as a voltage divider.

Characteristics such as conductivity and resistance of the edible electronic device 350 can be customized for certain applications. For example, width, thickness, and design of the conductive foil can be adjusted for desirable electrical attributes. In some examples, the circuit is a heater, a resistor, an electronic trace, a capacitor, an inductor, a sensor, or a passive wireless circuit.

In some examples, an edible electronic device can be formed into a performance material, such as a chip-less near field communication (NFC), RFID, or other functional antenna. For example, a chipless RFID tag using a simple "C" shape to can be used with any of the above implementations in order to eliminate the need for additional connections or wires and enable fully passive operation of the transient electronic sensors.

RFID operations include an antenna transmitting a radio signal to a tag and measuring reflected signals. In some examples, the tag controls the shape of the reflected waveform using a chip. However, unique antenna patterns based on time- or frequency-domain reflectometry can also change the reflected waveform and eliminate the need for a chip. By doing so, such RFID tags can be easily printed and destroyed in an eco-friendly manner. A hybrid tag data encoding method can be used, which changes the magnitude of the resonance peaks in the radar cross section (RCS). A C-shaped metallic strip resonator can resonate between 2.5 GHz and 7.5 GHz. This design enables encoding of up to 22.9 bits in a dimension of 2 cm×4 cm through absence/presence and frequency shift coding techniques.

The wireless resonator can be integrated it into any of the substrates discussed above (e.g., hydrographic film, wax, edible medium). For example, a PVA-based water leakage sensor with a printed "C" shape resonator design can be attached to areas that might have potential water-leakage risk without risk to a wire connection and power supply. In edible electronic device applications, a chipless RFID design can signal the destruction of the edible electronic device during digestion. In wax-based electronic device applications, LEDs (e.g., the LEDs 276 shown in FIG. 19) can be replaced with wireless resonators in order to transmit information wirelessly. The wireless resonator, when incorporated into a substrate, can reduce or eliminate the need for external electronic connections or batteries. This reduces the need for protection of external electronic connections and batteries, which may fail or become damaged in the presence of a water leak or other environmental conditions. Additionally, by eliminating external electronic connections and batteries, installation and maintenance is simplified.

Figure 22A:
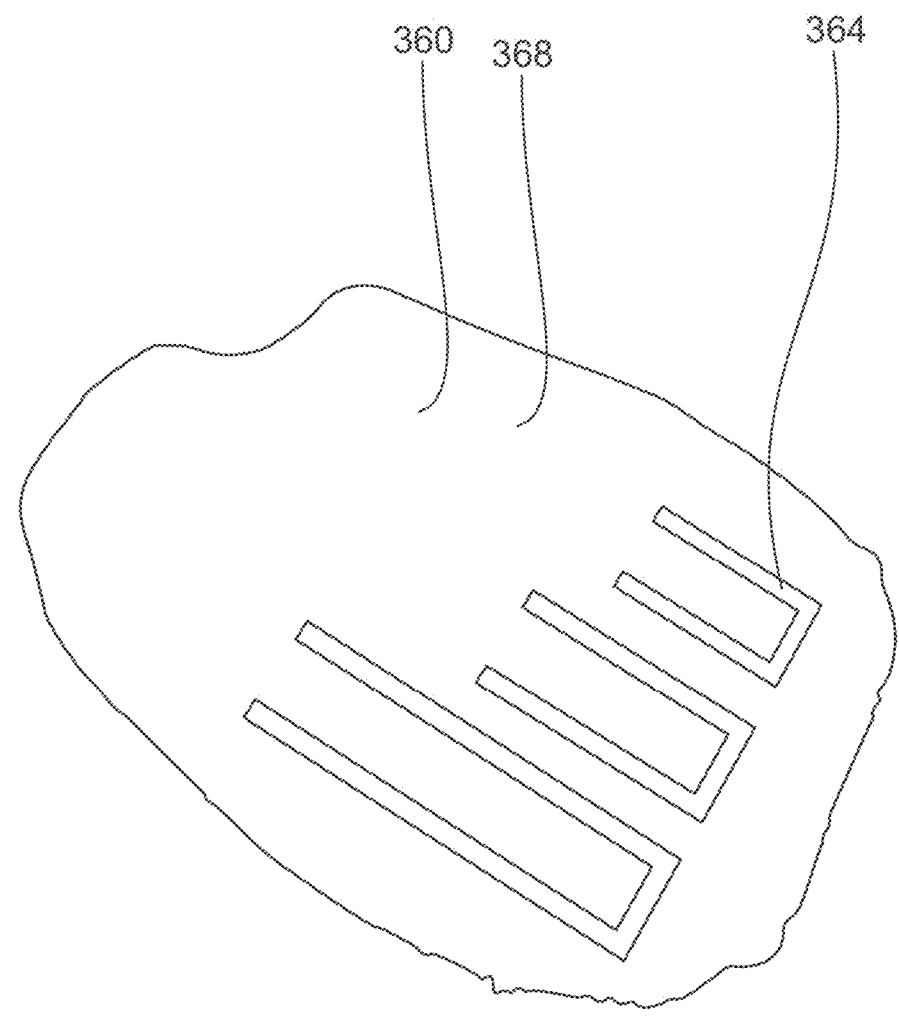
FIG. 22A is an example edible chip-less radio frequency identification (RFID) device manufactured in accordance with the method of FIG. 20.

FIG. 22A is an example edible chip-less RFID device 360 manufactured in accordance with the method of FIG. 20. The edible electronic device 360 of FIG. 22A can include an edible RFID protocol that is integrated into a chocolate. In this example, the edible foil 364 is shaped, encoding, and integrated into chocolate 368. The foil 364 includes three different C-shaped designs of varying sizes and widths that can be suitable for an RFID.

Incorporating a metallic resonator design in transient electronics can be used to enable fully passive and chipless RF detection. Such chipless RFID technology requires no soldering process or non-recyclable components and allows transient electronic devices to interact with other systems. Thus, the disclosed devices can be passive and chipless, such that they do not require connection to wires or external batteries, making the device more useful in real-world contexts.

FIGS. 22B-E show an example implementation of a RFID device with a water-soluble layer.

Figures 22B, 22C, 22D, 22E:
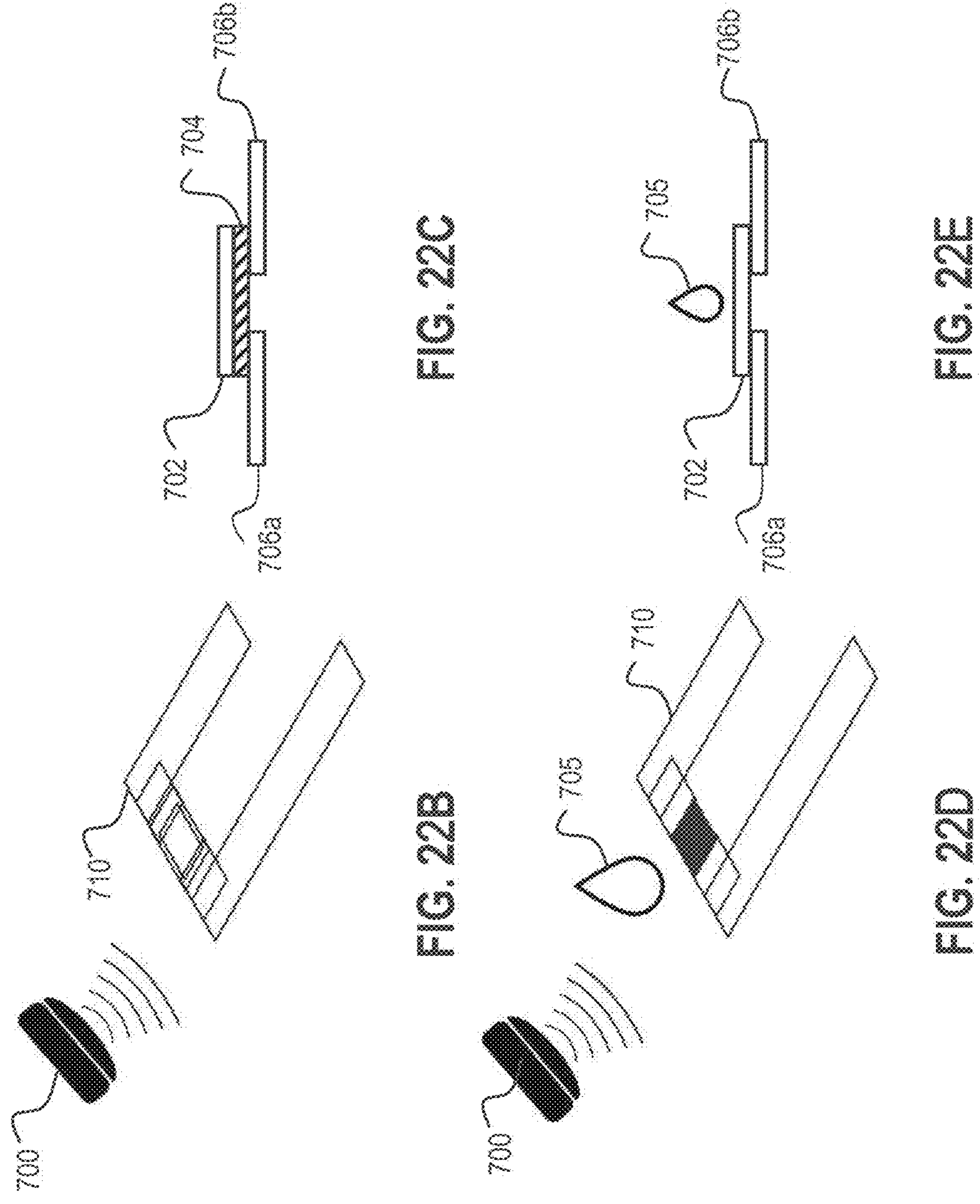
FIGS. 22B-E show an example implementation of a RFID device with a water-soluble layer.

FIG. 22B shows a perspective view of example RFID device 710 and a transceiver 700. The transceiver 700 can be an active RF transceiver or a passive RF transceiver. In an example in which the transceiver 700 is an active RF transceiver, the transceiver 700 emits electromagnetic radiation, which can be reflected from the RFID device 710, and the transceiver 700 receives the reflected electromagnetic radiation. In an example in which the transceiver 700 is a passive transceiver, the transceiver 700 can receive ambient electromagnetic radiation that reflects off of the RFID device 710. For example, WiFi signals can reflect off of the RFID device 710 and the reflected WiFi signals can be received by the transceiver 700.

FIG. 22C shows a cross-sectional view of the RFID device 710. The RFID device 710 includes a first antenna structure 702 and a second antenna structure including components 706*a*, 706*b*. The first antenna structure 702 is separated from the components 706*a*, 706*b* by a water soluble layer 704. When the water soluble layer 704 is in solid form, the water soluble layer 704 prevent electrical current from flowing between the components 706*a*, 706*b* of the first antenna structure and the second antenna structure 702. The transceiver 700 receives a backscatter signal from electromagnetic radiation reflected from the RFID device 710. In some examples, because the first antenna structure 702 and the second antenna structure are separated by the water soluble layer 704, the transceiver 700 is unable to detect a backscatter signal reflected from the RFID device 710.

FIG. 22D shows a perspective view of the example RFID device 710 exposed to water 705. FIG. 22E shows a cross-sectional view of the example RFID device 710 exposed to water 705. When the RFID device 710 is exposed to the water 705, the water soluble layer 704 dissolves. The first antenna structure 702 then contacts the components 706*a*, 706*b* of the second antenna structure, creating an electrical connection from the component 706*a* of the first antenna structure 702 to the component 706*b*. The transceiver 700 then receives a modified backscatter signal reflected from the RFID device 710.

The modified backscatter signal received from the RFID device 710 after dissolution of the water soluble layer 704 is different from the backscatter signal received from the RFID device 710 prior to dissolution of the water soluble layer 704. In some examples, the modified backscatter signal received from the RFID device 710 after dissolution of the water soluble layer 704 has a greater amplitude than the backscatter signal received from the RFID device 710 prior to dissolution of the water soluble layer 704. In some examples, the transceiver is unable to detect a backscatter signal reflected from the RFID device 710 until the water soluble layer 704 dissolves.

Figure 23A:
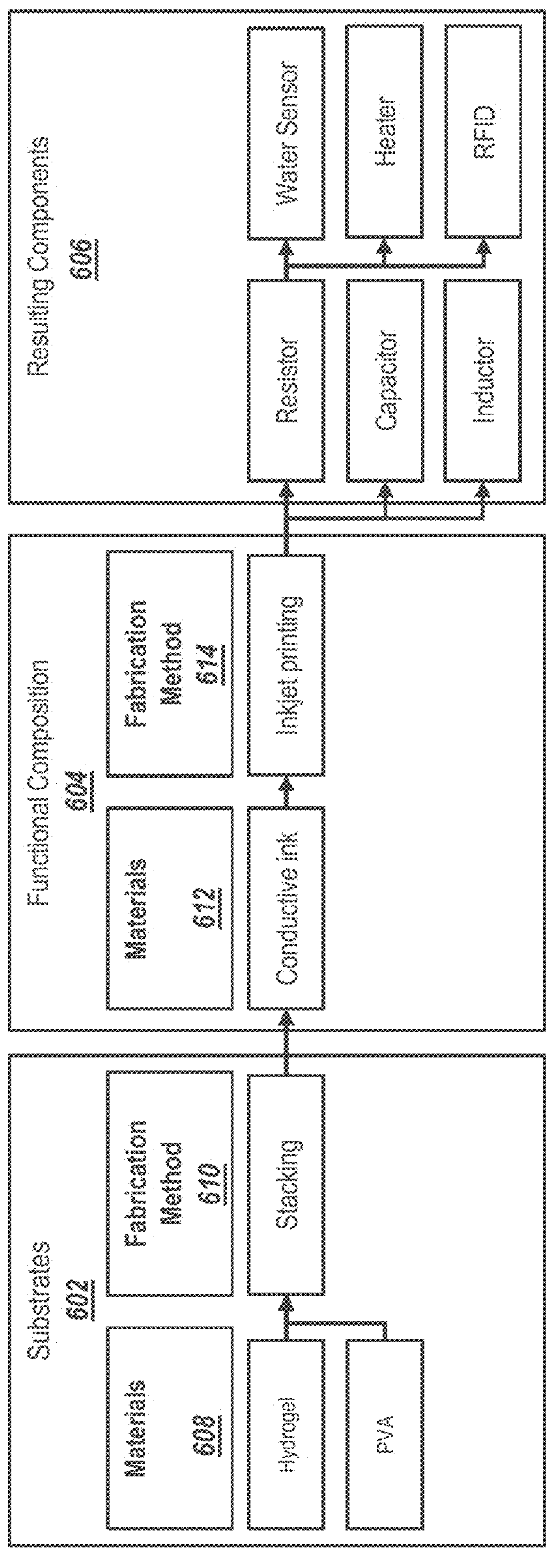
FIGS. 23A-D show examples substrates, functional compositions, and resulting components of devices manufactured in accordance with implementations of the present disclosure.

FIG. 23A shows example substrates 602, functional compositions 604, and resulting components 606 of water soluble electronics. Substrates 602 can be formed from materials 608 such as hydrogel and PVA, and can be fabricated 610 through stacking. The functional composition 604 (e.g., circuit) can be formed from materials 612 such as conductive ink, and can be fabricated 614 through inkjet printing. Resulting components 606 include resistors, capacitors, water sensors, heaters, and RFID devices.

Figure 23B:
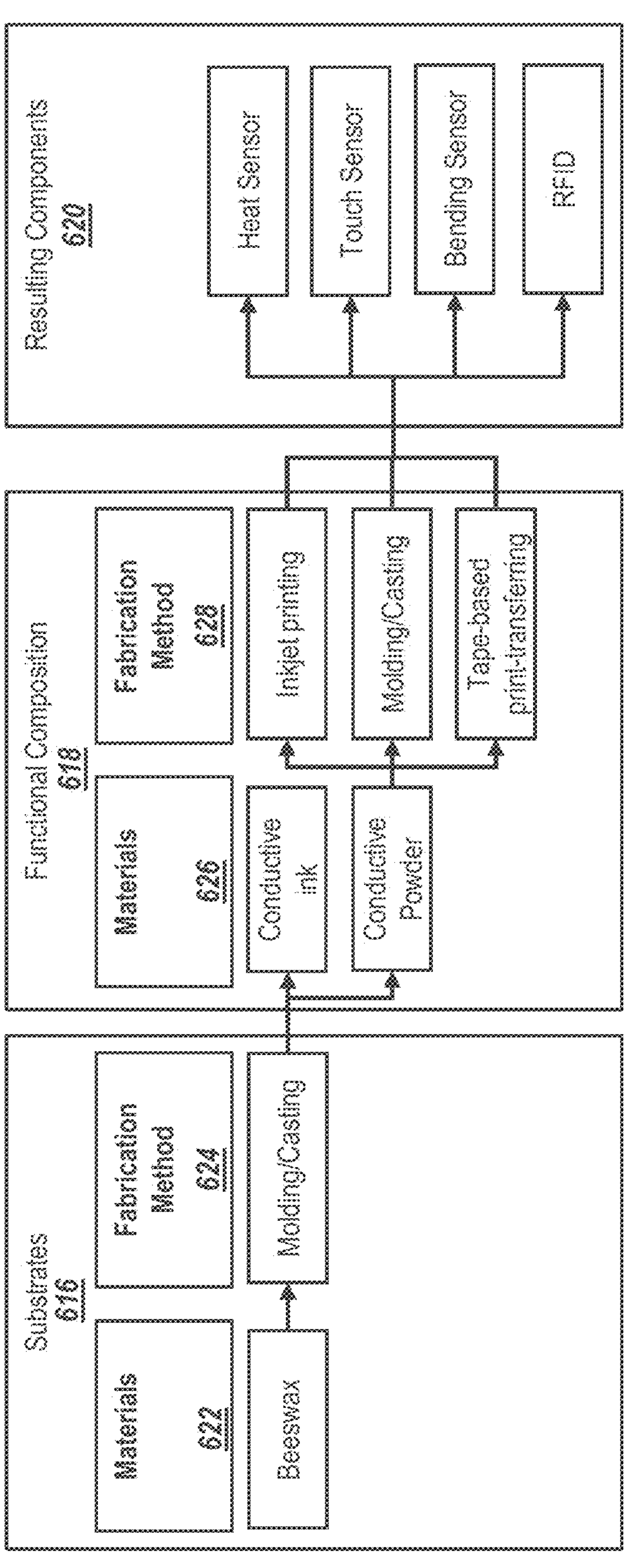

FIG. 23B shows example substrates 616, functional compositions 618, and resulting components 620 of heat-meltable electronics. Substrates 616 can be formed from materials 622 such as beeswax, and can be fabricated 624 through molding and casting. The functional composition 618 (e.g., circuit) can be formed from materials 626 such as conductive ink and conductive powder, and can be fabricated 628 through inkjet printing, molding and casting, and tape-based print transferring. Resulting components 620 include heat sensors, touch sensors, bending sensors, and RFID devices.

Figure 23C:
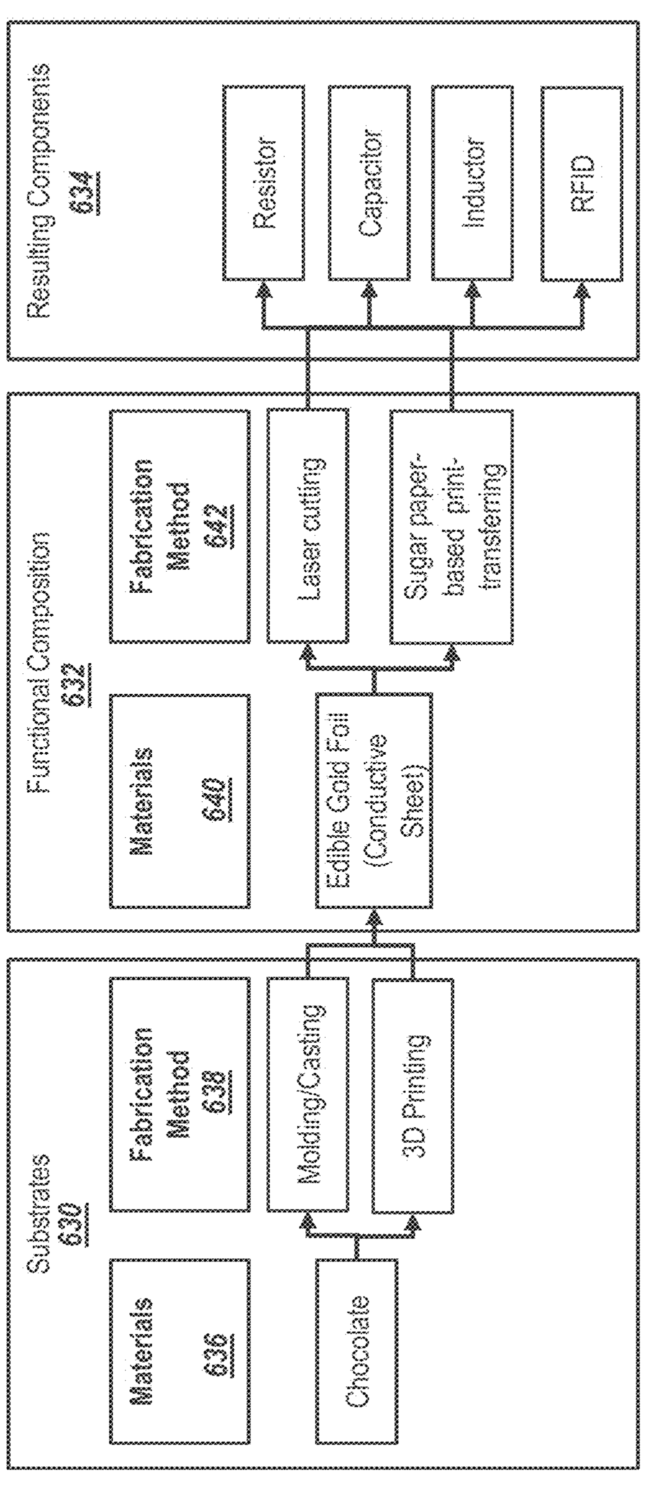

FIG. 23C shows example substrates 630, functional compositions 632, and resulting components 634 of edible electronics. Substrates 630 can be formed from materials 636 such as chocolate, and can be fabricated 638 through molding and casting and three-dimensional printing. The functional composition 632 (e.g., circuit) can be formed from materials 640 such as edible gold foil, and can be fabricated 642 through laser cutting and sugar paper-based print-transferring. Resulting components 634 include resistors, capacitors, inductors, and RFID devices.

Figure 23D:
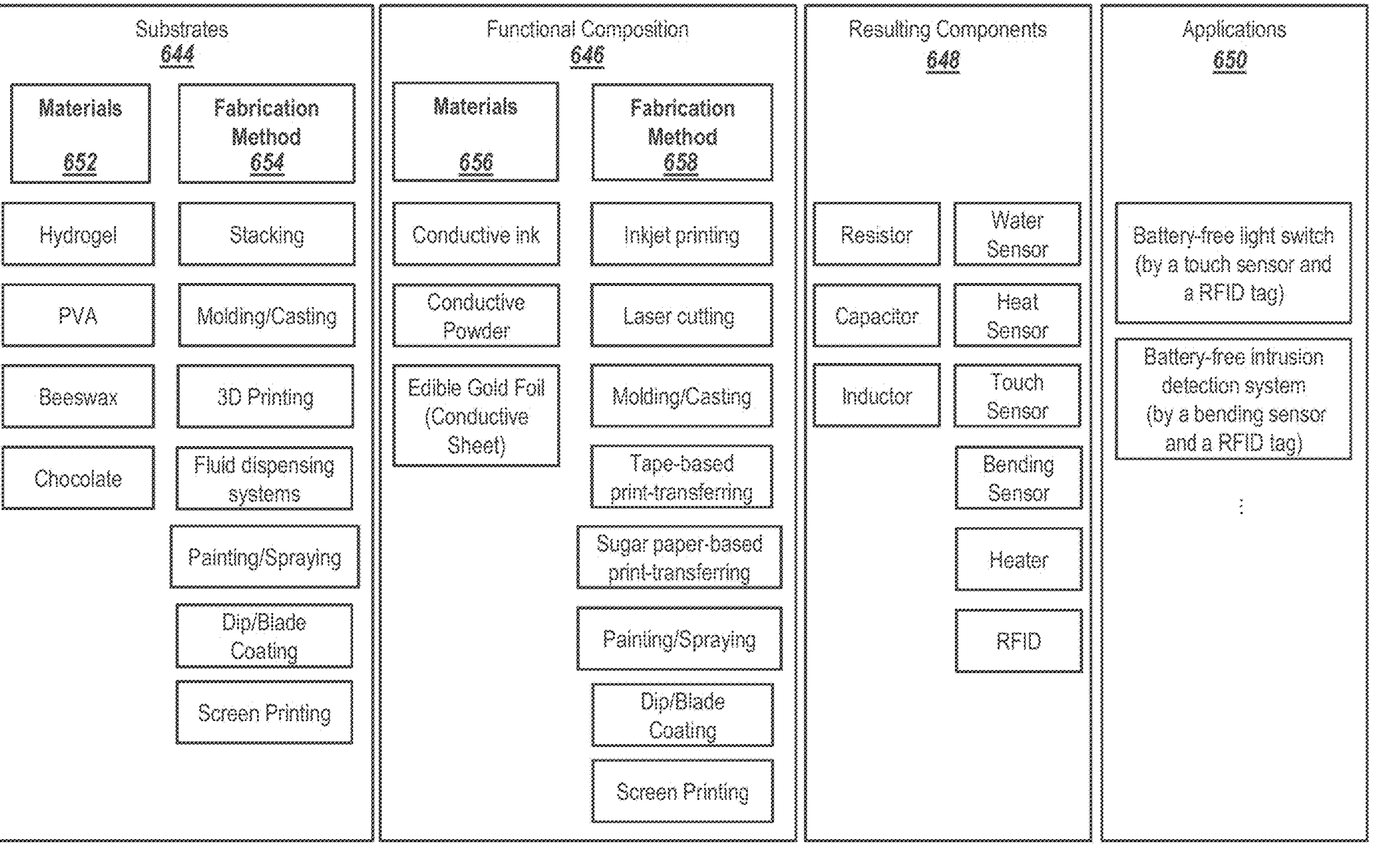

FIG. 23D shows example substrates 644, functional compositions 646, resulting components 648, and applications 650 of implementations in accordance with the present disclosure.

Substrates 644 can be formed from materials 652 including hydrogel, PVA, beeswax, and chocolate. Substrates 644 can be formed through fabrication methods 654 such as stacking, molding and casting, three-dimensional printing, fluid dispensing systems, painting and spraying, dip coating, blade coating, and screen printing.

Functional compositions 646 can be formed from materials 656 including conductive ink, conductive powder, and edible gold foil. Functional compositions 646 can be formed through fabrication methods 658 such as inkjet printing, laser cutting, molding and casting, tape-based print transferring, sugar paper-based print transferring, painting, spraying, dip coating, blade coating, and screen printing.

Resulting components 648 can include resistors, capacitors, inductors, water sensors, heat sensors, touch sensors, bending sensors, heaters, and RFID devices.

Applications 650 can include a battery-free light switch including a touch sensor and an RFID tag, and a battery-free intrusion detection system including a bending sensor and an RFID tag.

While the invention has been disclosed in particular embodiments, it will be understood by those skilled in the art that certain substitutions, alterations and/or omissions may be made to the embodiments without departing from the spirit of the invention. Accordingly, the foregoing description is meant to be exemplary only, and should not limit the scope of the invention. All references (including those listed above), scientific articles, patent publications, and any other documents cited herein are hereby incorporated by reference for the substance of their disclosure.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a sub combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking may be advantageous. Moreover, the separation of various system modules and components in the embodiments described above should not be understood as requiring such separation in all embodiments, and it should be understood that the described components and systems can generally be integrated together in a single product or packaged into multiple products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results.

What is claimed is:

1. A method of manufacturing a dissolvable electronic device, comprising:

forming a dissolvable sheet;

applying a self-sintering agent to the dissolvable sheet to form a substrate; and depositing electrically conductive ink onto the substrate in a trace to obtain the dissolvable electronic device.

2. The method of claim 1, wherein applying the self-sintering agent to the dissolvable sheet comprises coating the dissolvable sheet with the self-sintering agent, the self-sintering agent comprising at least one of: aluminum-oxide and silicon dioxide.

3. The method of claim 1, wherein the dissolvable sheet is formed from a solidifiable water-soluble synthetic polymer material.

4. The method of claim 1, comprising forming the dissolvable sheet in an additive manufacturing operation, including:

providing one or more materials for the dissolvable sheet to a three-dimensional printer device; and providing instructions to the three-dimensional printer device to prepare the dissolvable sheet, wherein the three-dimensional printer device is selected from: a fused deposition modeling printer, a stereolithography printer, a digital light processing printer, a selective laser sintering printer, a selective laser melting printer, a laminated object manufacturing printer, and a digital beam melting printer.

5. The method of claim 1, comprising forming the dissolvable sheet by stacking, including:

selecting a first rate of dissolvability for the dissolvable sheet;

determining a first thickness of a solidifiable water-soluble material that corresponds to the first rate of dissolvability; and stacking one or more layers of the solidifiable water-soluble material to form the dissolvable sheet, the dissolvable sheet having the first thickness.

6. The method of claim 1, wherein depositing the electrically conductive ink onto the substrate comprises forming a design to create a circuit with the electrically conductive ink, the circuit comprising at least one of: a heater, a resistor, an electronic trace, a capacitor, an inductor, a sensor, and a passive wireless circuit.

7. The method of claim 1, comprising forming the dissolvable sheet in an additive manufacturing operation, including:

selecting a first rate of dissolvability for the dissolvable sheet;

determining a first thickness of a solidifiable water-soluble material that corresponds to the first rate of dissolvability; and depositing, by a three-dimensional printer, one or more layers of the solidifiable water-soluble material to form the dissolvable sheet, the dissolvable sheet having the first thickness.

8. The method of claim 1, comprising forming the dissolvable sheet in an additive manufacturing operation, including:

selecting a first rate of dissolvability for a first portion of the dissolvable sheet;

determining a first thickness of a solidifiable water-soluble material that corresponds to the first rate of dissolvability;

selecting a second rate of dissolvability for a second portion of the dissolvable sheet;

determining a second thickness of the solidifiable water-soluble material that corresponds to the second rate of dissolvability;

depositing, by a three-dimensional printer, one or more layers of the solidifiable water-soluble material to form the first portion of the dissolvable sheet having the first thickness; and depositing, by the three-dimensional printer, one or more layers of the solidifiable water-soluble material to form the second portion of the dissolvable sheet having the second thickness.

9. The method of claim 1, comprising:

selecting a first conductivity of the trace;

determining a first amount of the electrically conductive ink that corresponds to the first conductivity; and depositing, by one of an inkjet printer, an additive manufacturing machine, a screen printing machine, a painting device, or a stenciling device, the first amount of the electrically conductive ink onto the substrate in the trace, the trace having the first conductivity.

10. The method of claim 1, comprising coupling a substrate to a hydrogel-embedded fabric to form a water leakage sensor, wherein the substrate is configured to dissolve when water passes through the hydrogel-embedded fabric.

* * * * *